(12) United States Patent
Wei

(10) Patent No.: US 9,515,210 B2
(45) Date of Patent: Dec. 6, 2016

(54) DIODE BARRIER INFRARED DETECTOR DEVICES AND SUPERLATTICE BARRIER STRUCTURES

(71) Applicant: L-3 Communications Cincinnati Electronics Corporation, Mason, OH (US)

(72) Inventor: Yajun Wei, Cincinnati, OH (US)

(73) Assignee: L-3 Communications Cincinnati Electronics Corporation, Mason, OH (US)

( * ) Notice: Subject to any disclaimer, the term of this patent is extended or adjusted under 35 U.S.C. 154(b) by 0 days.

(21) Appl. No.: 14/271,908

(22) Filed: May 7, 2014

(65) Prior Publication Data
US 2014/0332755 A1    Nov. 13, 2014

Related U.S. Application Data

(60) Provisional application No. 61/820,416, filed on May 7, 2013.

(51) Int. Cl.
| | | |
|---|---|---|
| *H01L 31/0352* | (2006.01) | |
| *H01L 31/101* | (2006.01) | |
| *H01L 31/0304* | (2006.01) | |

(52) U.S. Cl.
CPC . *H01L 31/035236* (2013.01); *H01L 31/03046* (2013.01); *H01L 31/101* (2013.01); *Y02E 10/544* (2013.01)

(58) Field of Classification Search
CPC ................... H01L 31/035236; H01L 31/03046
(Continued)

(56) References Cited

U.S. PATENT DOCUMENTS

| 4,679,063 A | 7/1987 | White |
|---|---|---|
| 6,455,908 B1 | 9/2002 | Johnson et al. |

(Continued)

FOREIGN PATENT DOCUMENTS

| CN | 101814545 | 8/2010 |
|---|---|---|
| JP | S5316592 | 2/1978 |

(Continued)

OTHER PUBLICATIONS

Hood, Andrew D., et al. "LWIR strained-layer superlattice materials and devices at Teledyne Imaging Sensors." Journal of Electronic Materials 39.7 (2010): 1001-1006.*

(Continued)

*Primary Examiner* — Fernando L Toledo
*Assistant Examiner* — Adam S Bowen
(74) *Attorney, Agent, or Firm* — Dinsmore & Shohl LLP

(57) ABSTRACT

Diode barrier infrared detector devices and superlattice barrier structures are disclosed. In one embodiment, a diode barrier infrared detector device includes a first contact layer, an absorber layer adjacent to the first contact layer, and a barrier layer adjacent to the absorber layer, and a second contact layer adjacent to the barrier layer. The barrier layer includes a diode structure formed by a p-n junction formed within the barrier layer. The barrier layer may be such that there is substantially no barrier to minority carrier holes. In another embodiment, a diode barrier infrared detector device includes a first contact layer, an absorber layer adjacent to the first contact layer, a barrier layer adjacent to the absorber layer, and a diode structure adjacent to the barrier layer. The diode structure includes a second contact layer.

20 Claims, 21 Drawing Sheets

(58) Field of Classification Search
USPC .......................................................... 257/21
See application file for complete search history.

(56) References Cited

U.S. PATENT DOCUMENTS

| | | | |
|---|---|---|---|
| 6,566,724 | B1 | 5/2003 | Gutierrez-Aitken et al. |
| 6,603,184 | B2 | 8/2003 | Lin et al. |
| 6,809,350 | B1 | 10/2004 | Berger et al. |
| 7,030,406 | B2 | 4/2006 | Edamura et al. |
| 7,652,252 | B1 | 1/2010 | Rajavel et al. |
| 7,737,411 | B2 | 6/2010 | Gunapala et al. |
| 7,795,640 | B2 | 9/2010 | Klipstein |
| 7,928,473 | B2 | 4/2011 | Klipstein |
| 8,003,434 | B2 | 8/2011 | Maimon |
| 8,004,012 | B2 | 8/2011 | Klipstein |
| 8,044,435 | B2 | 10/2011 | Scott et al. |
| 8,072,801 | B2 | 12/2011 | Velicu et al. |
| 8,217,480 | B2 | 7/2012 | Ting et al. |
| 8,299,497 | B1 | 10/2012 | Klem et al. |
| 8,362,520 | B2 | 1/2013 | Scott et al. |
| 8,368,051 | B2 | 2/2013 | Ting et al. |
| 8,373,155 | B2 | 2/2013 | Okamura et al. |
| 8,399,910 | B2 | 3/2013 | Scott et al. |
| 8,450,773 | B1 | 5/2013 | Kim et al. |
| 2003/0089958 | A1* | 5/2003 | Gutierrez-Aitken ............ H01L 31/03046 257/458 |
| 2010/0155777 | A1 | 6/2010 | Hill et al. |
| 2010/0230720 | A1* | 9/2010 | Wicks ................... B82Y 20/00 257/188 |
| 2012/0145996 | A1* | 6/2012 | Ting ....................... B82Y 20/00 257/21 |
| 2012/0223362 | A1 | 9/2012 | Belenky et al. |
| 2013/0146998 | A1 | 6/2013 | Ting et al. |

FOREIGN PATENT DOCUMENTS

| | | |
|---|---|---|
| JP | 200805397 | 9/2008 |
| WO | WO2005004243 | 1/2005 |
| WO | WO2005050722 | 6/2005 |
| WO | WO2005112132 | 11/2005 |
| WO | WO2009049087 | 4/2009 |
| WO | WO2010093058 | 8/2010 |

OTHER PUBLICATIONS

Salihoglu, Omer, et al. "N structure for type-II superlattice photodetectors." Applied Physics Letters 101.7 (2012): 073505.*

Rodriguez et al, A type-ii superlattice period with a modified InAs to GaSb thickness ratio for midwavelength infrared photodiode improvement, Appl. Phys. Lett. 97, 251113 (2010).

Rakovska et al, Room temperature InAsSb photovoltaic midinfrared detector, Appl. Phys. Lett. 97, 397 (2000).

Rahman et al, Modeling of a type-II antimonide based superlattice for novel optical switching applications, Department of Electrical and Electronic Engineering, Bangladesh University of Engineering and Technology, Dhaka-1000, Bangladesh (2009).

Kim et al, Mid-IR focal plane array based on type-II InAs/GaSb strain layer superlattice detector with nBn design, Appl. Phys. Lett. 92, 183502 (2008).

Carras et al, Interface band gap engineering in InAsSb photodiodes, Appl. Phys. Lett. 87, 102103 (2005).

Plis et al, Bias switchable dual-band InAs/GaSb superlattice detector with pBp architecture, IEEE Photonics Journal 3(2): 234-240, Apr. 2011.

Plis et al, Voltage controllable dual-band response from InAs/GaSb strained layer superlattice detectors with nBn design, Electronics Letters, 47(2), Jan. 20, 2011.

Hill et al, High temperature operation of long-wavelength infrared superlattice detector with suppressed dark current, Electronics Letters 45(21), Oct. 8, 2009.

Gautam et al, Barrier engineered infrared photodetectors based on type-II InAs/GaSb strained layer superlattices, IEEE Journal of Quantum Electronics, 49(2):211-217, Feb. 2013.

Savich et al, Dark current filtering in unipolar barrier infrared detectors, Appl. Phys. Lett. 99, 121112 (2011).

Maimon et al, nBn detector, an infrared detector with reduced dark current and higher operating temperature, Appl. Phys. Lett. 89, 151109 (2006).

Myers et al, The effect of absorber doping on electrical and optical properties of nBn based type-II InAs/GaSb strained layer superlattice infrared detectors, Appl. Phys. Lett. 95, 121110 (2009).

Extended European Search Report issued in corresponding EP Appln. No. 14167441.6, dated Mar. 30, 2015.

Salihoglu et al, "'N' structure for type-II superlattice photodetectors," Applied Physics Letters 101, 073505-1-4 (2012).

Hood et al, "LWIR Strained-Layer Superlattice Materials and Devices at Teledyne Imaging Sensors," Journal of Electronic Materials, 39:7, pp. 1001-1006 (2010).

Mohammedy et al, "Growth and fabrication issues of GaSb-based detectors," J. Mater. Sci.: Mater Electron 20:1039-1058 (2009).

Aifer et al, "Dual band LWIR/VLWIR type-II superlattice photodiodes," Infrared Technology and Applications XXXI, Proc. of SPIE, vol. 5783, pp. 112-119 (2005).

* cited by examiner

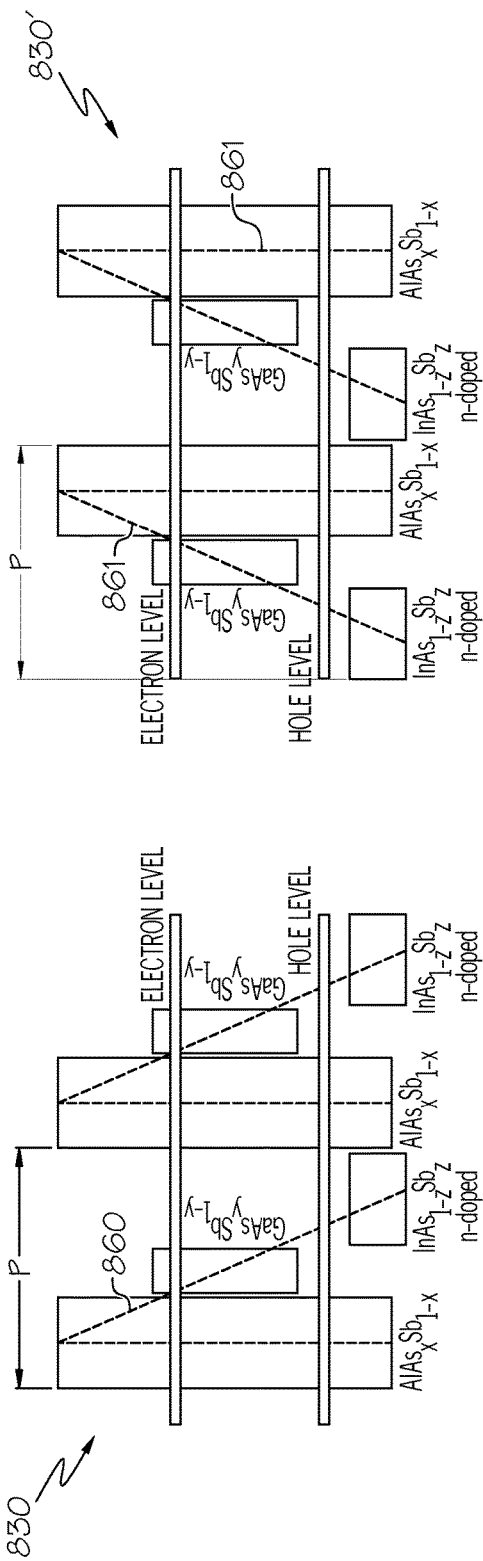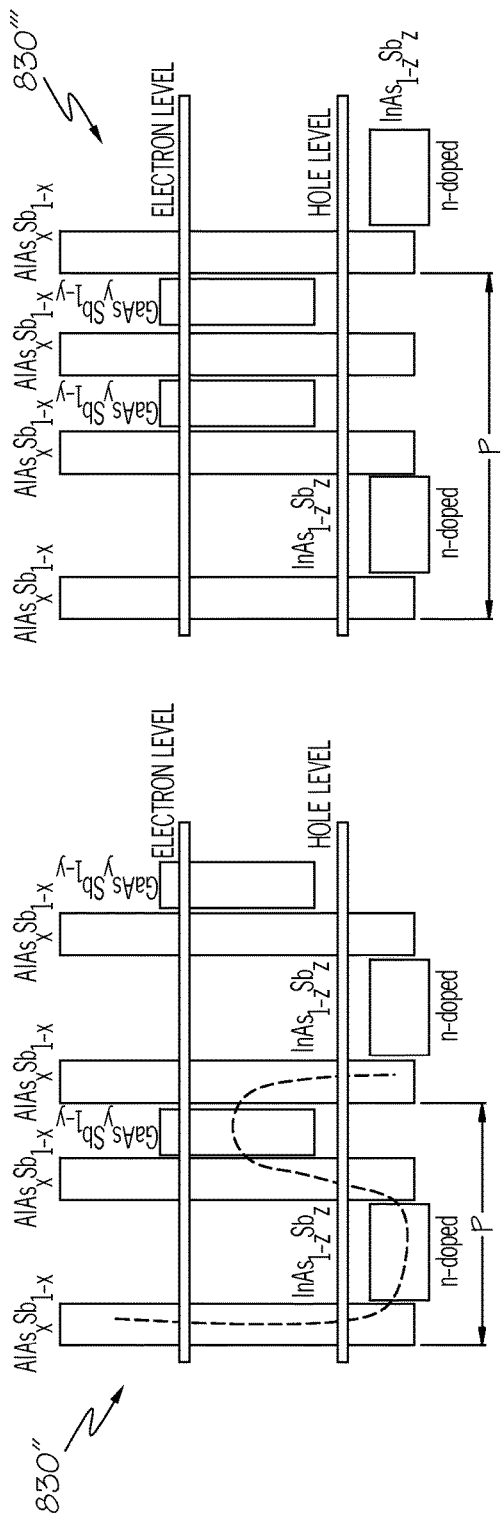
FIG. 9A
FIG. 9B
FIG. 9C
FIG. 9D

DIODE BARRIER INFRARED DETECTOR DEVICES AND SUPERLATTICE BARRIER STRUCTURES

CROSS-REFERENCE TO RELATED APPLICATIONS

This application claims the benefit of U.S. Provisional Application No. 61/820,416, filed on May 7, 2013.

BACKGROUND

Field

The present specification generally relates to infrared detector devices and, more particularly, to barrier infrared detector devices and structures for reducing dark current, lowering bias voltage, and increasing operating temperature for infrared detectors such as focal plane arrays.

Technical Background

The nBn device structure has been used to improve the operating temperature of photoconductive infrared detectors by blocking the flow of electrons. The nBn device structure generally includes an n-type absorber layer, a barrier layer to block majority carriers, and an n-type contact layer. Such nBn devices have been shown to improve the operating temperature of mid-wave infrared (MWIR) focal plane arrays (FPA) using Ga free InAs/InAsSb super lattice structure (SLS) absorber material. FPA devices using the nBn device structure require some bias to turn on the photocurrent, while the dark current density increases at the same time. To increase the operating temperature further, it is necessary to further lower the bias voltage required to turn on the photocurrent and reduce the dark current.

SUMMARY

These and additional features provided by the embodiments described herein will be more fully understood in view of the following detailed description, in conjunction with the drawings.

In a first aspect of the disclosure, a diode barrier infrared detector device includes a first contact layer, an absorber layer adjacent to the first contact layer, a barrier layer adjacent to the absorber layer, and a second contact layer adjacent to the barrier layer. The barrier layer includes a diode structure formed by a p-n junction formed within the barrier layer.

In a second aspect of the disclosure, a diode barrier infrared detector device according to the first aspect, wherein the barrier layer is such that there is substantially no barrier to minority carrier holes.

In a third aspect of the disclosure, a diode barrier infrared detector device according to the first or second aspects, wherein the p-n junction formed within the barrier layer is closer to the second contact layer than the absorber layer.

In a fourth aspect of the disclosure, a diode barrier infrared detector device according to any of the preceding aspects, wherein the diode structure includes an n-doped barrier layer adjacent to the absorber layer, and a p-doped barrier layer disposed between the n-doped barrier layer and the second contact layer.

In a fifth aspect of the disclosure, a diode barrier infrared detector device according to the fourth aspect, wherein the n-doped barrier layer has a thickness that is greater than a thickness of the p-doped barrier layer.

In a sixth aspect of the disclosure, a diode barrier infrared detector device according to the fifth aspect, wherein the n-doped barrier layer has a doping profile such that a doping level within the n-doped barrier layer increases from the first contact layer to the p-doped barrier layer.

In a seventh aspect of the disclosure, a diode barrier infrared detector device according to a diode barrier infrared detector device according to the fourth aspect, wherein the n-doped barrier layer includes a first n-doped barrier region having a first doping level, a second n-doped barrier region having a second doping level, and a third n-doped barrier region having a third doping level. The first n-doped barrier region is adjacent to the absorber layer, the third n-doped barrier region is adjacent to the second contact layer, and the second n-doped barrier region is disposed between the first n-doped barrier region and the third n-doped barrier region. The third doping level is greater than the second doping level, and the second doping level is greater than the first doping level.

In an eighth aspect of the disclosure, a diode barrier infrared detector device according to the seventh aspect, wherein a thickness of the first n-doped barrier region is greater than a thickness of the third n-doped barrier region, and the thickness of the third n-doped barrier region is greater than a thickness of the second n-doped barrier region.

In a ninth aspect of the disclosure, a diode barrier infrared detector device according to the eighth aspect, wherein the first doping level is about $2.5 \times 10^{15}$, the second doping level is about $6.0 \times 10^{16}$, the third doping level is about $1.7 \times 10^{17}$, and a doping level of the p-doped barrier layer is about $3.0 \times 10^{17}$.

In a tenth aspect of the disclosure, a diode barrier infrared detector device according to any preceding aspect, wherein the absorber layer comprises an n-doped InAs/InAsSb superlattice structure, and the barrier layer comprises AlAsSb or AlGaAsSb.

In an eleventh aspect of the disclosure, a diode barrier infrared detector device according to the fourth aspect, wherein the n-doped barrier layer is doped at a doping level such that at least a portion of a valence band edge within the barrier layer is less than an a lowest valence band edge within the absorber layer.

In a twelfth aspect of the disclosure, a diode barrier infrared detector device according to the eleventh aspect, wherein the doping level of the n-doped barrier layer is about $3.0 \times 10^{16}$, and a doping level of the p-doped barrier layer is about $4.0 \times 10^{17}$.

In a thirteenth aspect of the disclosure, a diode barrier infrared detector device according to the eleventh aspect, wherein the n-doped barrier layer includes a first n-doped barrier region having a first doping level, a second n-doped barrier region having a second doping level, and a third n-doped barrier region having a third doping level. The first n-doped barrier region is adjacent to the absorber layer, the third n-doped barrier region is adjacent to the second contact layer, and the second n-doped barrier region is disposed between the first n-doped barrier region and the third n-doped barrier region. The third doping level is greater than the second doping level, and the second doping level is greater than the first doping level.

In fourteen aspect of the disclosure, a diode barrier infrared detector device according to the thirteenth aspect, wherein a thickness of the first n-doped barrier region is greater than a thickness of the third n-doped barrier region, and the thickness of the third n-doped barrier region is greater than a thickness of the second n-doped barrier region.

In a fifteenth aspect of the disclosure, a diode barrier infrared detector device according to the fourteenth aspect, wherein the first doping level is about $2.5 \times 10^{15}$, the second doping level is about $6.0 \times 10^{16}$, the third doping level is about $2.0 \times 10^{17}$, and a doping level of the p-doped barrier layer is about $3.0 \times 10^{17}$.

In a sixteenth aspect of the disclosure, a diode barrier infrared detector device according to the fourth aspect, wherein the absorber layer includes an n-doped semiconductor material capable of absorbing photons in a long-wave infrared wavelength range, the n-doped barrier layer is n-doped, graded AlGaAsSb, the p-doped barrier layer comprises p-doped AlAsSb, and the second contact layer is a p-doped semiconductor material.

In a seventeenth aspect of the disclosure, a diode barrier infrared detector device according to any preceding aspect, wherein a depletion region is contained entirely within the barrier layer.

In an eighteenth aspect of the disclosure, a diode barrier infrared detector device according to the first, second or seventeenth aspects, wherein the barrier layer comprises a superlattice structure including an arbitrary repeating sequence of an $AlAs_xSb_{1-x}$ layer, a $GaAs_ySb_{1-y}$ layer, and an $InAs_{1-z}Sb_z$ layer, wherein the $InAs_{1-z}Sb_z$ layers are n-doped, and the $AlAs_xSb_{1-x}$ layers and the $GaAs_ySb_{1-y}$ layers are unintentionally doped.

In nineteenth aspect of the disclosure, a superlattice barrier structure includes an arbitrary repeating sequence of an $AlAs_xSb_{1-x}$ layer, a $GaAs_ySb_{1-y}$ layer, and an $InAs_{1-z}Sb_z$ layer defining a superlattice structure, wherein the $InAs_{1-z}Sb_z$ layers are n-doped, and the $AlAs_xSb_{1-x}$ layers and the $GaAs_ySb_{1-y}$ layers are unintentionally doped.

In a twentieth aspect of the disclosure, a superlattice barrier structure according to the nineteenth aspect, wherein the repeating sequence of $AlAs_xSb_{1-x}$, $GaAs_ySb_{1-y}$, and $InAs_{1-z}Sb_z$ define a period of the superlattice structure, and the period is such that a first layer is $AlAs_xSb_{1-x}$, a second layer is $GaAs_ySb_{1-y}$, and a third layer is $InAs_{1-z}Sb_z$.

In a twenty-first aspect of the disclosure, a superlattice barrier structure according to the nineteenth aspect, wherein the repeating sequence of $AlAs_xSb_{1-x}$, $GaAs_ySb_{1-y}$, and $InAs_{1-z}Sb_z$ define a period of the superlattice structure, and the period is such that a first layer is $InAs_{1-z}Sb_z$, a second layer is $GaAs_ySb_{1-y}$, and a third layer is $AlAs_xSb_{1-x}$.

In a twenty-second aspect of the disclosure, a superlattice barrier structure according to the nineteenth aspect, wherein the repeating sequence of $AlAs_xSb_{1-x}$, $GaAs_ySb_{1-y}$, and $InAs_{1-z}Sb_z$ define a period of the superlattice structure, and the period is such that a first layer is $AlAs_xSb_{1-x}$, a second layer is $InAs_{1-z}Sb_z$, a third layer is $AlAs_xSb_{1-x}$, and a fourth layer is $GaAs_ySb_{1-y}$.

In a twenty-third aspect of the disclosure, a superlattice barrier structure according to the nineteenth aspect, wherein the repeating sequence of $AlAs_xSb_{1-x}$, $GaAs_ySb_{1-y}$, and $InAs_{1-z}Sb_z$ define a period of the superlattice structure, and the period is such that a first layer is $AlAs_xSb_{1-x}$, a second layer is $InAs_{1-z}Sb_z$, a third layer through an mth layer is an number of repeating layers of $AlAs_xSb_{1-x}$ and $GaAs_ySb_{1-y}$.

In a twenty-fourth aspect of the disclosure, a diode barrier infrared detector device utilizing an n-type absorber includes a first contact layer, wherein the first contact layer is doped n-type, an absorber layer adjacent to the first contact layer, wherein the absorber layer is doped n-type, a barrier layer adjacent to the absorber layer, an n-type material layer adjacent to the barrier layer, and a second contact layer adjacent to the n-type material layer, wherein the second contact layer is p-doped.

In a twenty-fifth aspect of the disclosure, a diode barrier infrared detector device according to the twenty-fourth aspect, wherein the n-type material layer and the second contact layer are made of a material having a wider bandgap than a material of the absorber layer.

In a twenty-sixth aspect of the disclosure, a diode barrier infrared detector device, a diode barrier infrared detector device according to the twenty-fourth aspect, further including a nominally undoped graded gap section disposed between the n-type material layer and the second contact layer.

In a twenty-seventh aspect of the disclosure, a diode barrier infrared detector device according to any of the twenty-fourth through twenty-sixth aspects, wherein the n-type material layer is doped at a doping level such that at least a portion of a valence band edge within the n-type material layer is lower than a valence band edge within the absorber layer.

In twenty-eighth aspect of the disclosure, a diode barrier infrared detector device utilizing a p-type absorber includes a first contact layer, wherein the first contact layer is doped p-type, an absorber layer adjacent to the first contact layer, wherein the absorber layer is doped p-type, a barrier layer adjacent to the absorber layer, a p-type material layer adjacent to the barrier layer, and a second contact layer adjacent to the p-type material layer, wherein the second contact layer is n-doped.

In a twenty-ninth aspect of the disclosure, a diode barrier infrared detector device according to the twenty-eighth aspect, wherein the p-type material layer and the second contact layer are made of a material having a wider bandgap than a material of the absorber layer.

In a thirtieth aspect of the disclosure, a diode barrier infrared detector device according to the twenty-eighth aspect, further including a nominally undoped i region disposed between the p-type material layer and the second contact layer.

In a thirty-first aspect of the disclosure, a diode barrier infrared detector device according to the twenty-eighth aspect, further including a nominally undoped graded gap section disposed between the p-type material layer and the second contact layer.

In a thirty-second aspect of the disclosure, a diode barrier infrared detector device according to any of the twenty-eighth through thirty-first aspects, wherein the n-type material layer is doped at a doping level such that at least a portion of a valence band edge within the n-type material layer is lower than a valence band edge within the absorber layer.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

FIGS. 9A-9D are graphic illustrations of four exemplary superlattice barrier structures according to embodiments described and illustrated herein.

DETAILED DESCRIPTION

Embodiments of the present disclosure are directed to diode barrier infrared detector devices. More specifically, in the embodiments described herein, an n-doped barrier material is grown right after the n-type absorber layer, followed by p-type barrier material, then a matching p-type contact layer. The barrier layers have zero or almost zero valance band offset from the material of the absorber layer. A diode structure is formed within the barrier layer, thereby providing a built-in electric field for close to zero bias optical turn on, while also limiting the depletion region within the barrier layer within small bias range. The diode barrier infrared detector device may be provided in an array to form an imaging device, such as a focal plane array.

Several techniques are also described herein to extend the usable bias range. A grading scheme is also disclosed within the barrier layer to allow proper valence band alignment to ternary AlAsSb material for long-wave infrared ("LWIR") Ga-free superlattice structure ("SLS") based barrier infrared detector devices. It should be understood that, although embodiments are described in the context of mid-wave infrared ("MWIR") and LWIR Ga-free SLS devices, embodiments described herein are generally applicable to any infrared wavelength regime.

Additionally, a barrier structure for the Ga-free SLS is also introduced. This barrier structure comprises an arbitrary repeating sequence of $AlAs_xSb_{1-x}/GaAs_ySb_{1-y}/InAs_{1-z}Sb_z$ layers forming a SLS. This SLS barrier layer may be doped n-type precisely using silicon that is readily available in a molecular beam epitaxy ("MBE") system.

Embodiments of the present disclosure are also directed to a structure utilizing n-type absorber wherein an n-doped material is grown right after the barrier layer, which is followed by a p-type contact layer. The barrier layer is nominally undoped. In this structure, the p-n junction is formed after the barrier layer, rather than of within. The generation-recombination ("GR") current, and any possible tunneling current generated within the p-n junction, is blocked by the barrier layer, while the device still benefits from the built-in electric field formed by the p-n junction. In addition, for the p-n junction, wider gap materials can be used to reduce the absorption wasted before infrared radiation pass through the barrier layer.

Embodiments of the present disclosure are also directed to a structure utilizing p-type absorber wherein a p-doped material is grown right after the barrier layer, which is followed by an n-type contact layer. The barrier layer is nominally undoped. In addition, for the p-n junction, wider gap materials can be used to reduce the absorption wasted before infrared radiation pass through the barrier layer.

Figure 1A:
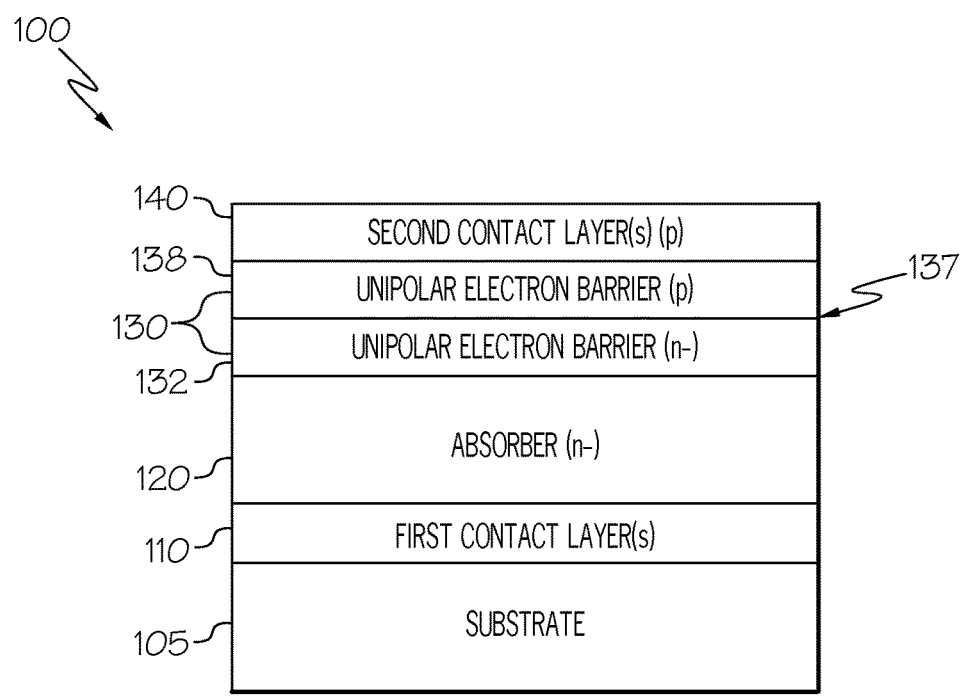
FIG. 1A is a schematic illustration of an exemplary diode-barrier infrared detector ("DBIRD") device according to one or more embodiments described and illustrated herein.
Figure 1B:
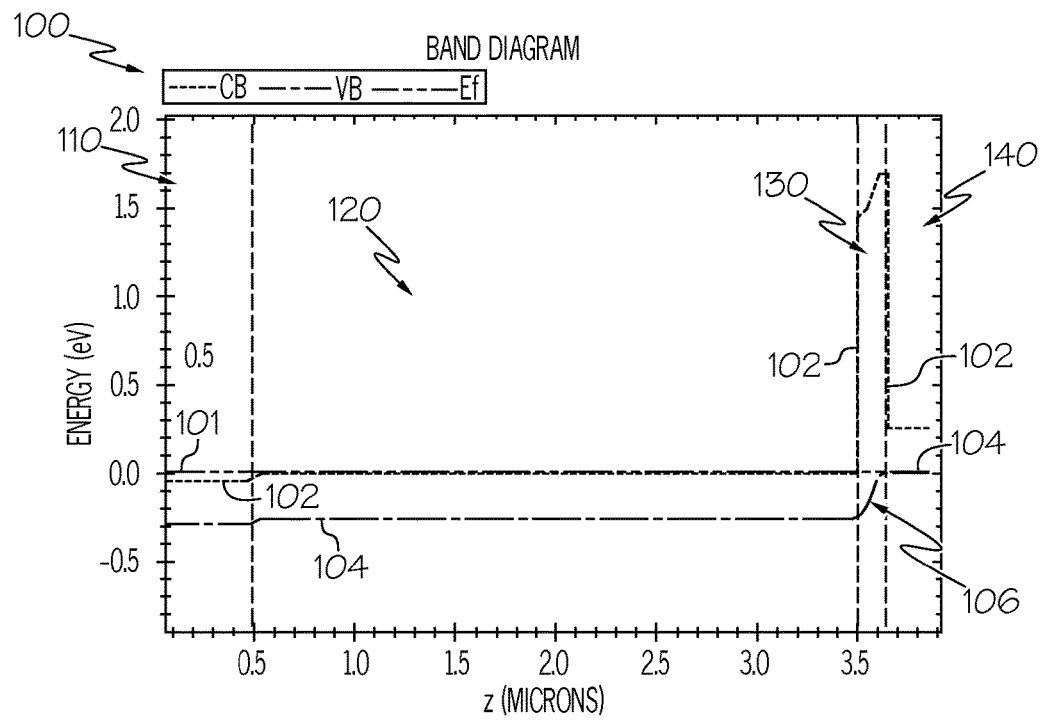
FIG. 1B is a graphic illustration of a band diagram for the DBIRD device illustrated in FIG. 1A according to one or more embodiments described and illustrated herein.

Referring now to FIGS. 1A and 1B, a schematic illustration and a band diagram of an exemplary diode barrier infrared detector ("DBIRD") device 100 are illustrated. The example DBIRD device 100 comprises a substrate 105, a first contact layer 110 (i.e., a first collector layer) on the substrate 105, followed by an absorber layer 120, a barrier layer 130, and a second contact layer 140 (i.e., a second collector layer). In the example DBIRD device 100, the first contact layer 110 is a doped n-type semiconductor material, while the second contact layer 140 is a doped p-type semiconductor material. The absorber layer 120 is an n-doped semiconductor material capable of absorbing photons in a desired wavelength range. As non-limiting examples, the absorber layer 120 may comprise an n-doped InAs/InAsSb SLS, and the barrier layer 130 may comprise AlAsSb or AlGaAsSb. In some embodiments, the contact layer 140 is p-doped InAs/InAsSb SLS.

Line 101 represents the Fermi energy ("Ef"), while curve 102 is the conduction band and curve 104 is the valence band for the DBIRD device 100 of FIG. 1A. As shown in FIG. 1A, majority carriers are blocked by the barrier layer 130, while minority carriers are free to pass through the barrier layer 130.

Figure 2:
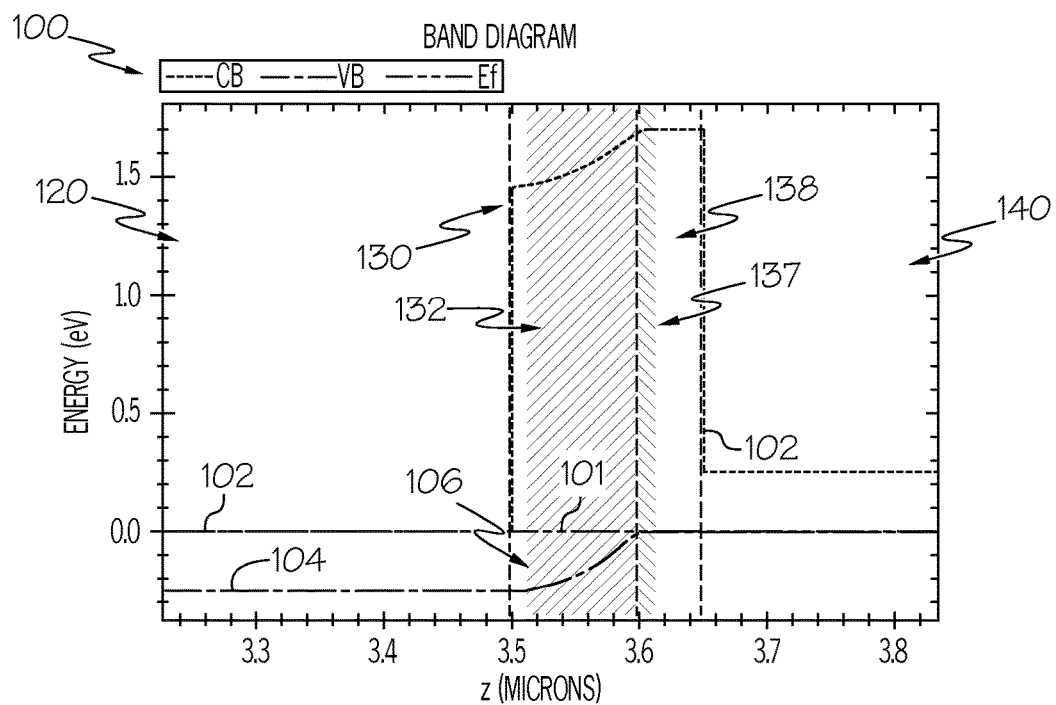
FIG. 2 is a graphic illustration of another band diagram for the DBIRD device depicted in FIG. 1A.

FIG. 2 depicts a closer view of the absorber layer 120 and the barrier layer 130 of the DBIRD device 100 depicted in FIGS. 1A and 1B. As shown in FIG. 2, the barrier layer 130 includes a p-n junction 137 formed by a relatively thicker n-doped barrier layer 132 adjacent to a relatively thinner p-doped barrier layer 138. A depletion region 106 is formed within the barrier layer 130 by the p-n junction 137. The capping SLS is used to collect the signal carriers and is doped to a level such that no hole-barrier will exist. If the p doping level is too low, the valence band offset (VBO) of the contact layer 140 will lie below that of the p-doped barrier layer 138, creating a potential barrier blocking the hole transport. Infrared light that is absorbed in the absorber layer 120 will generate electron-hole pairs. The minority carrier holes will diffuse into the depletion region 106 in the diode structure defined by the p-n junction 137, and get swept by the internal electrical field. This provides a photo response under substantially zero bias, unlike photoconductive nBn type structures. The thickness of the p-doped barrier layer 138 may be chosen to be as thin as possible such that the depletion region 106 does not extend into the second contact layer 140.

For a two layer (i.e., the number of doping levels within the barrier layer 130) barrier structure as shown in FIG. 2, the depletion region 106 tends to stretch very close to the absorber layer 120. Under even small bias conditions, it is possible that the depletion region 106 could stretch into the absorber layer 120, leading to increased dark current level due to generation-recombination processes. Embodiments described herein may reduce dark current under bias conditions by shifting the depletion region 106 further away from the absorber layer 120.

Figure 3:
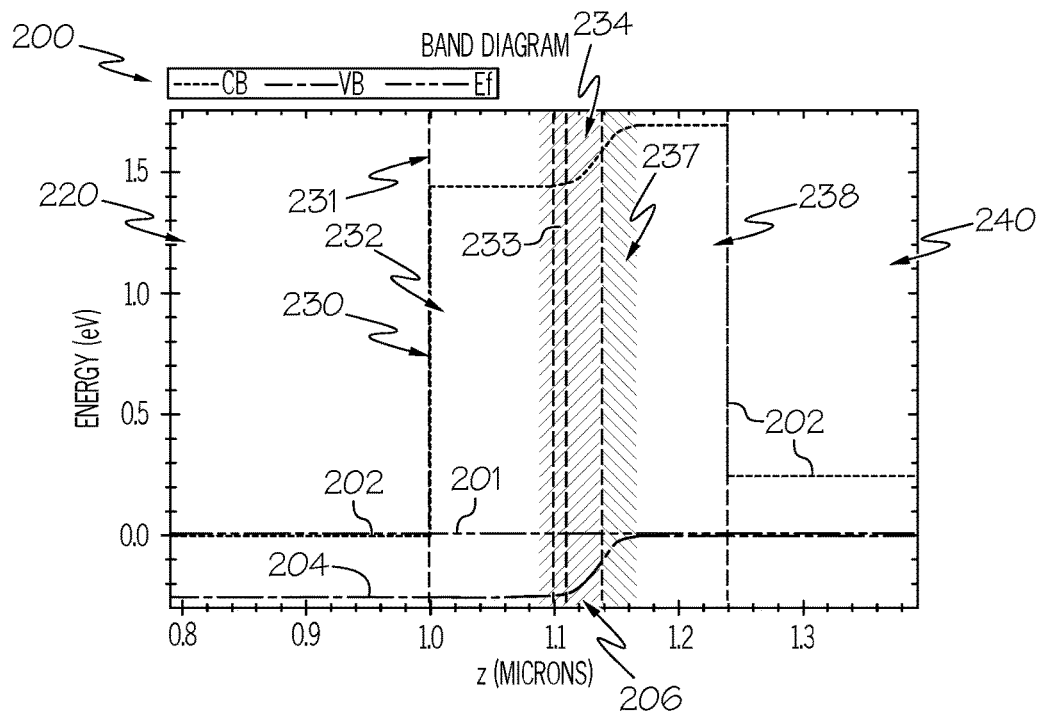
FIG. 3 is a graphic illustration of a band diagram for an exemplary DBIRD device having an n-doped barrier layer with doping profile to improve dark current stability under bias according to one or more embodiments described and illustrated herein.

FIG. 3 depicts another DBIRD device 200 comprising a first contact layer (not shown), an absorber layer 220, a barrier layer 230, and a second contact layer 240. The barrier layer 230 includes a p-doped barrier layer 238 and an n-doped barrier layer 231 having profiled doping that may be used to shift the depletion region 206 away from the absorber layer 220.

More specifically, the n-doped barrier layer 231 comprises a first n-doped barrier region 232 having a first doping level, a second n-doped barrier region 233 having a second doping level, and a third n-doped barrier region 234 having a third doping level. The third doping level is greater than the second doping level, while the second doping level is greater than the first doping level. This doping profile features a lower doping level and larger layer thickness in the first n-doped barrier region 232 closest to the absorber layer, while the higher doping level and thinner layer thickness of the third n-doped barrier region 234 is at the p-n junction 237. In one non-limiting example, the first doping the first doping level is about $2.5 \times 10^{15}$, the second doping level is about $6.0 \times 10^{16}$, the third doping level is about $1.7 \times 10^{17}$, and a doping level of the p-doped barrier layer is about $3.0 \times 10^{17}$. It should be understood that these doping levels are for illustrative purposes only, and that embodiments are not limited thereto.

Line 201 of FIG. 3 represents the Fermi energy ("Ef"), while curve 202 is the conduction band and curve 204 is the valence band for the DBIRD device 200 of FIG. 3. As compared to the depletion region 106 depicted in the band diagram of FIGS. 1 and 2, the depletion region 206 in the band diagram of FIG. 3 is shifted closer to the p-n junction 237 and the second contact layer 240.

Figure 4:
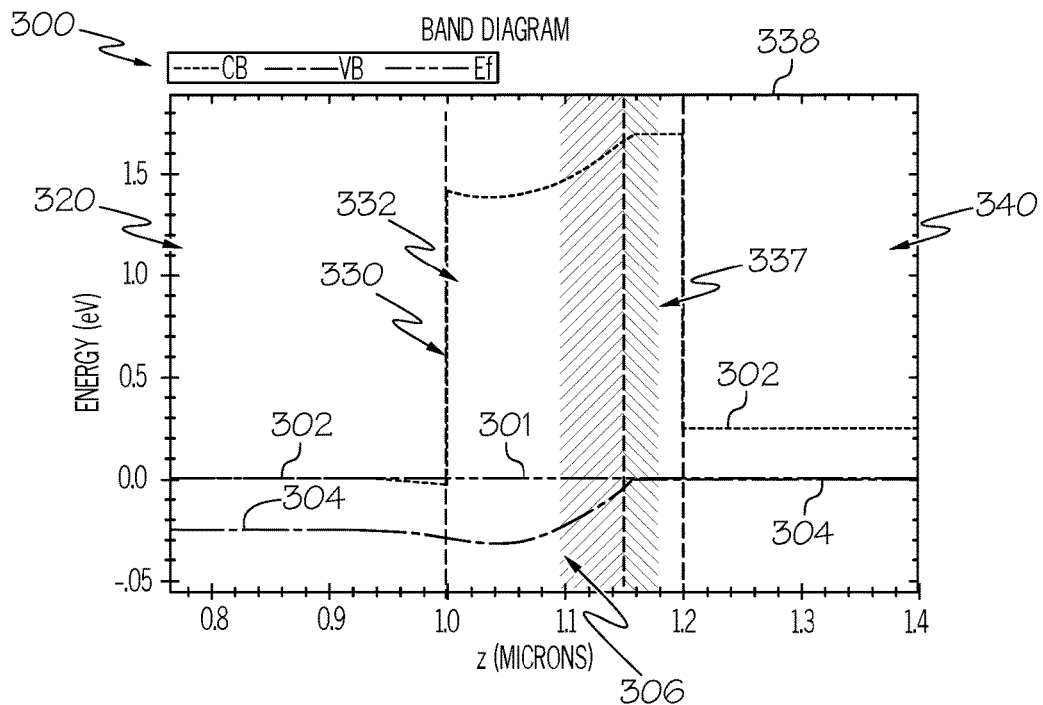
FIG. 4 is a graphic illustration of a band diagram for an exemplary DBIRD device having a barrier layer with a shallow hole barrier to control dark current according to one or more embodiments described and illustrated herein.

In some embodiments, slightly higher n-doping can be applied to create an intentional shallow hole barrier, as illustrated in the DBIRD device 300 depicted in FIG. 4 for a two layer diode barrier layer 330. This would ensure that the depletion region 306 is maintained within the barrier layer 330. Under a small bias voltage, the shallow hole barrier would be flattened out, allowing carrier holes to flow through and get collected.

Figure 5:
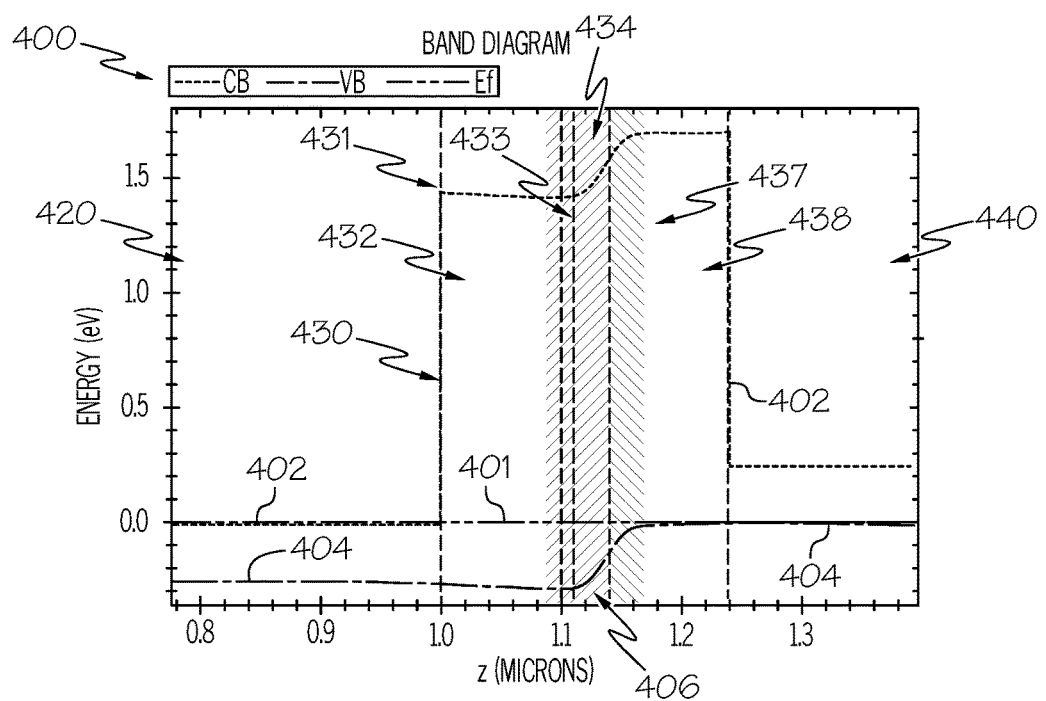
FIG. 5 is a graphic illustration of a band diagram for an exemplary DBIRD device having a barrier layer with a doping profile as well as a shallow hole barrier according to one or more embodiments described and illustrated herein.

The embodiment depicted in FIG. 4 is similar to the embodiment depicted in FIGS. 1 and 2, and includes a first contact layer (not shown), an absorber layer 320, a barrier layer 330, and a second contact layer 340. The barrier layer 330 includes an n-doped barrier layer 332 and a p-doped barrier layer 338 that form a p-n junction 337. Line 301 is the Fermi energy Ef, while curve 302 is the conduction band and curve 304 is the valence band. The n-doped barrier layer 332 is doped at a doping level such that at least a portion of a valence band edge within the barrier layer 330 is less than a valence band edge within the absorber layer as shown in FIG. 5 (i.e., a shallow hole barrier). As an example and not a limitation, the doping level of the n-doped barrier layer 332 may be about $3.0 \times 10^{16}$, and, in some embodiments, a doping level of the p-doped barrier layer is about $4.0 \times 10^{17}$.

Referring now to FIG. 5, an example DBIRD device 400 having both a shallow hole barrier and a doping profile to shift the depletion region toward the second contact layer 440 is shown. The DBIRD device 400 comprises a first contact layer (not shown), an absorber layer 420, a barrier layer 430, and a second contact layer 440. The barrier layer 430 includes a p-doped barrier layer 438 and an n-doped barrier layer 431 having profiled doping that may be used to shift the depletion region 406 away from the absorber layer 420.

Line 401 of FIG. 5 represents the Fermi energy ("Ef"), while curve 402 is the conduction band and curve 404 is the valence band for the DBIRD device 400 of FIG. 5. As compared to the depletion region 306 depicted in the band diagram of FIG. 4, the depletion region 406 in the band diagram of FIG. 5 is shifted closer to the p-n junction 437 and the second contact layer 440.

More specifically, the n-doped barrier layer 431 comprises a first n-doped barrier region 432 having a first doping level, a second n-doped barrier region 433 having a second doping level, and a third n-doped barrier region 434 having a third doping level. The third doping level is greater than the second doping level, while the second doping level is greater than the first doping level. This doping profile features a lower doping level and larger layer thickness in the first n-doped barrier region 432 closest to the absorber layer, while the higher doping level and thinner layer thickness of the third n-doped barrier region 434 is at the p-n junction 437. In one non-limiting example, the first doping level is about $2.5 \times 10^{15}$, the second doping level is about $6.0 \times 10^{16}$, the third doping level is about $2.0 \times 10^{17}$, and a doping level of the p-doped barrier layer is about $3.0 \times 10^{17}$. It should be understood that these doping levels are for illustrative purposes only, and that embodiments are not limited thereto.

For the DBIRD device 400 of FIG. 5, there is less valence band bending with a relatively large change in the barrier doping levels. As most of the device bias will be landed across the barrier layer 430, only moderate bias voltage is required to flatten out the shallow hole barrier. By applying this technique, optical turn-on bias may be sacrificed, but with much better control on dark current levels.

Figure 6:
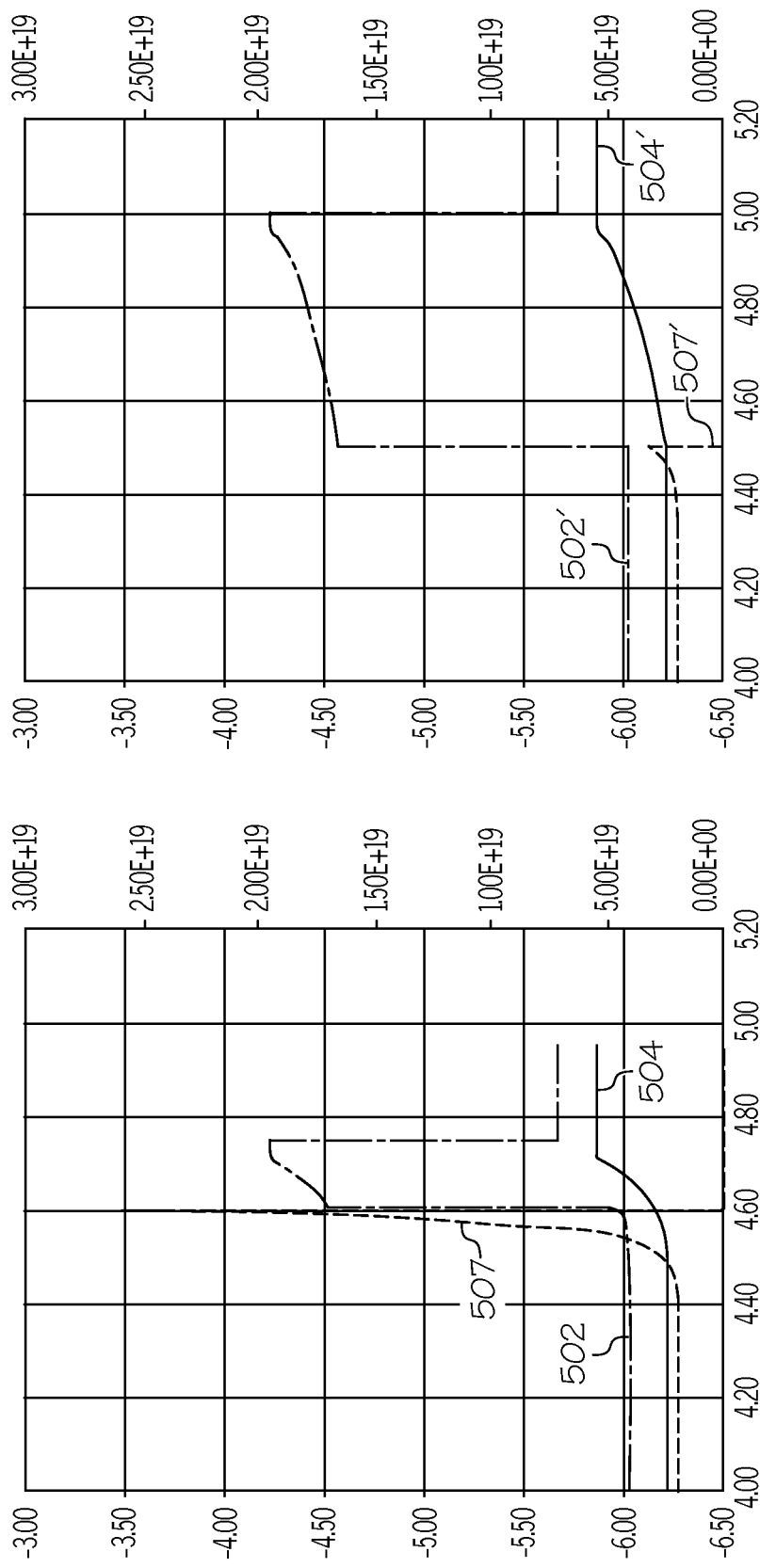
FIGS. 6A and 6B are a graphic illustrations of band diagrams and Shockley-Read-Hall recombination rates for a thinner barrier layer and a thicker barrier layer, respectively, under −0.2V bias operated at 160K according to one or more embodiments described and illustrated herein.
Figure 7:
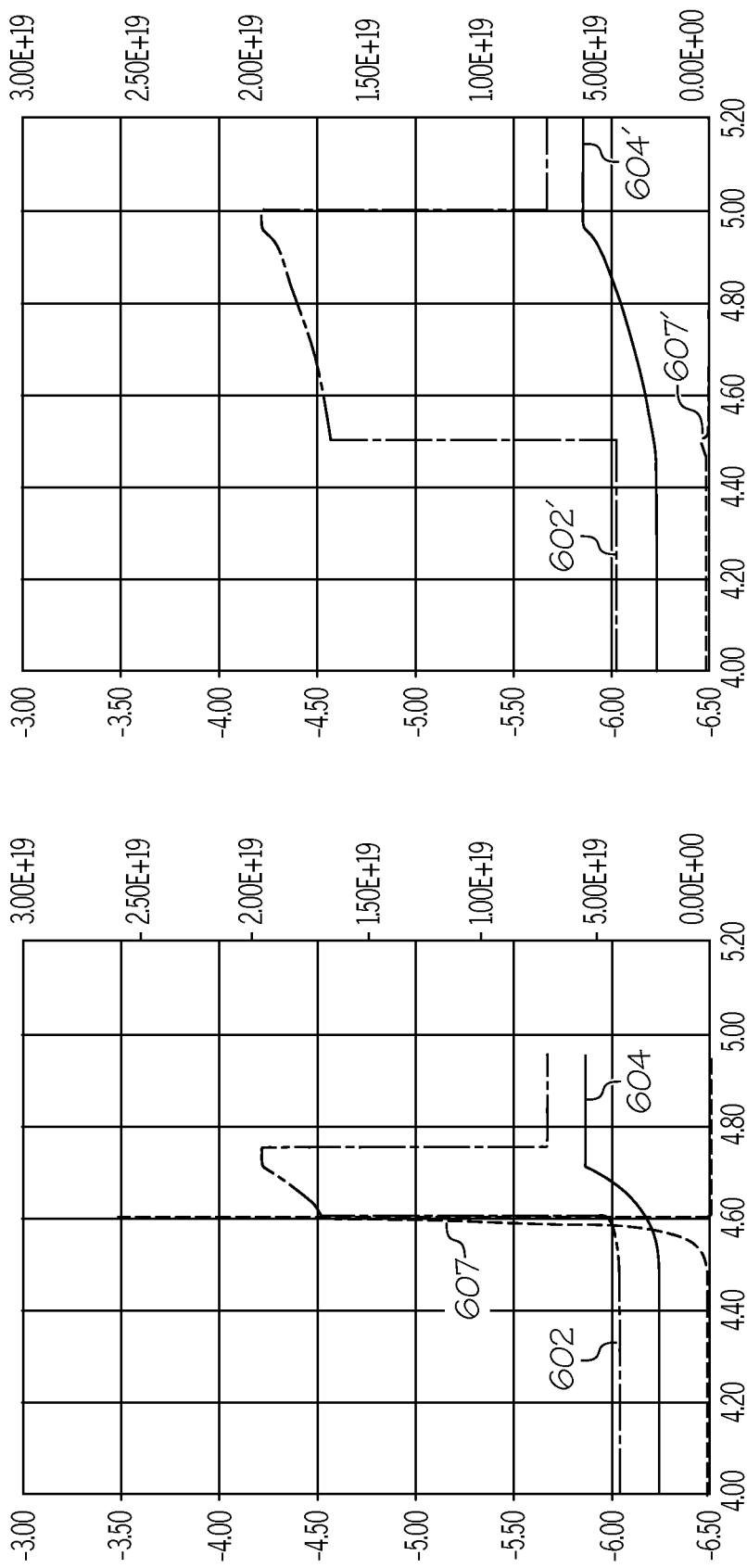
FIGS. 7A and 7B are a graphic illustrations of band diagrams and Shockley-Read-Hall recombination rates for a thinner barrier layer and a thicker barrier layer, respectively, under −0.2V bias operated at 120K according to one or more embodiments described and illustrated herein.

It is noted that a thicker barrier layer may also be used to further increase the starting biasing voltage to form a depletion region in the absorber layer. FIGS. 6A and 6B show the comparison between a thinner barrier layer (FIG. 6A) and a thicker barrier (FIG. 6B) at −0.2V bias operated at 160K, respectively. Curves 502 and 502' are the conduction bands in FIGS. 6A and 6B, respectively; curves 504 and 504' are the valence bands in FIGS. 6A and 6B, respectively; and curves 507 and 507' are the simulated Shockley-Read-Hall recombination rates (1/cm$^3$s) in FIGS. 6A and 6B, respectively. The horizontal axis is the thickness in a unit of μm. Similarly, FIGS. 7A and 7B show the comparison of a thinner barrier layer (FIG. 7A) as compared to a thicker barrier (FIG. 7B) at −0.2V bias operated at 120K. As shown in FIGS. 6A, 6B, 7A and 7B, the Shockley-Read-Hall recombination rate can be reduced dramatically using a thicker barrier technique without sacrificing optical turn on.

Figure 8:
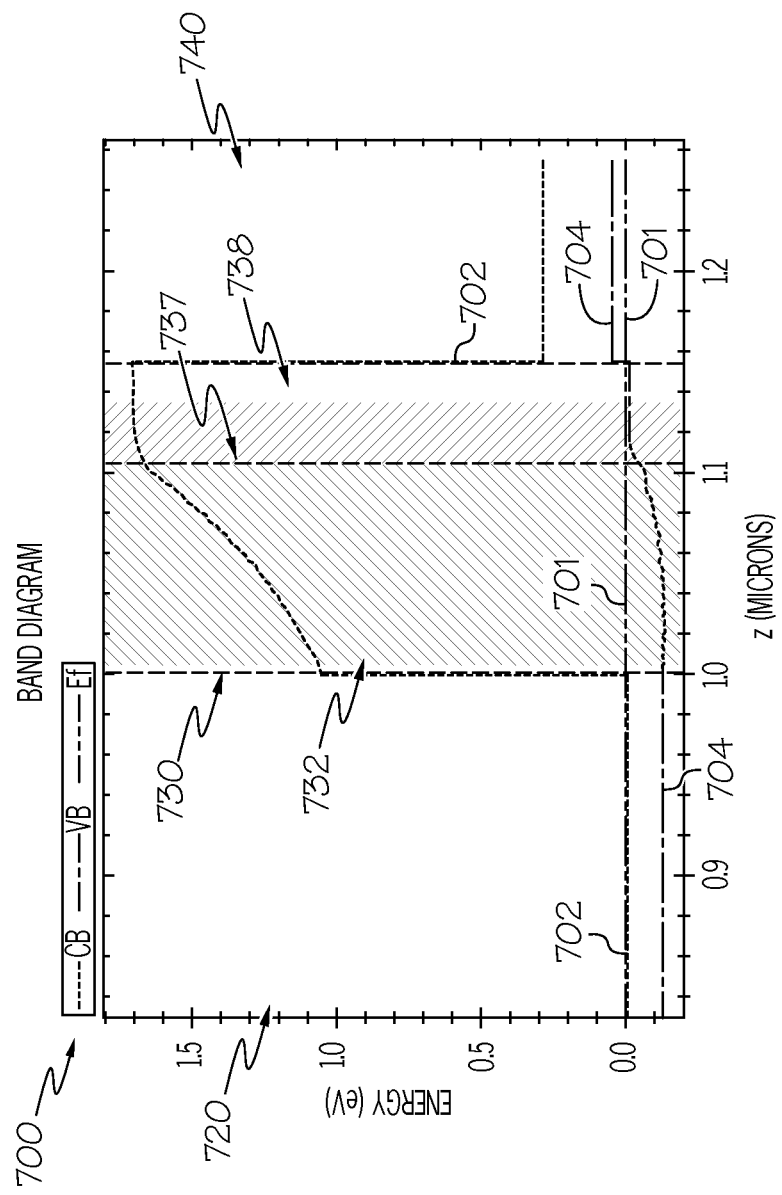
FIG. 8 is a graphic illustration of a band diagram for an exemplary long-wave infrared DBIRD device with a graded n-doped barrier according to one or more embodiments described and illustrated herein.

For materials with valence band offset mismatch between the absorber layer and the barrier layer, a transition region may be provided within the barrier layer. FIG. 8 depicts a DBIRD device 700 comprising a first contact (not shown), an absorber layer 720, a barrier layer 730, and a second contact layer 740. Line 701 of FIG. 8 represents the Fermi energy ("Ef"), while curve 702 is the conduction band and curve 704 is the valence band for the DBIRD device 400 of FIG. 5.

The barrier layer 730 comprises an n-doped barrier layer 732 and p-doped barrier layer 738 that define a p-n junction 737. The n-doped barrier layer 732 is graded to provide for a transition from an AlGaAsSb n-doped barrier layer 732 to an AlAsSb p-doped barrier layer 438. As there is virtually no barrier for holes, the device would have an optical turn on virtually at zero bias.

For example, for MWIR and LWIR materials based on the 6.1 Å family III-V materials, such as InAs/InAsSb SLS, a barrier materials that may be utilized are AlAsSb or AlGaAsSb compounds either lattice matched to the substrate or grown pseudomorphically within critical thickness. Molecular beam epitaxy is usually used to grow these materials due to the sharp interface control required for SLS and thin layers that are difficult to achieve with chemical vapor deposition techniques such as metalorganic vapor phase epitaxy.

Tellurium (Te) has been used extensively in molecular beam epitaxy systems to provide n-doping for antimonides. However, as Te has relatively high vapor pressure comparing with all other sources, consistent low level n-doping for the DBIRD devices disclosed herein may be difficult to achieve. Embodiments of the present disclosure are also directed to SLS-type barrier layer structures that may be used to resolve this issue with widely tunable valence band and conduction band positions.

More specifically, in some embodiments, a barrier scheme is utilized to resolve this issue without using Te cell. This barrier design comprises an arbitrary repeating sequence of $AlAs_xSb_{1-x}/GaAs_ySb_{1-y}/InAs_{1-z}Sb_z$ layers forming a superlattice structure. A superlattice is formed such that carriers will not "feel" individual quantum wells which could be detrimental to the carrier flow. As stated below, only the $InAs_{1-z}Sb_z$ layers are doped n-type.

FIGS. 9A-9D illustrate four example superlattice barrier structure designs that may be implemented in any of the barrier device structures disclosed herein. The dashed lines 860-860''' for FIGS. 9A-9D, respectively, provide visual guidance for the shapes of the band alignment profile. $AlAs_xSb_{1-x}$ provides a barrier potential for both electron and hole states. The thickness of $InAs_{1-z}Sb_z$ would primarily determine the electron energy level. The thickness of $GaAs_ySb_{1-y}$ would primarily determine the hole energy level. The sequence of the layers can be in principle rearranged in an arbitrary order. It should be understood that other configurations are also possible beyond the shown examples.

FIG. 9A depicts a triangular barrier layer 830 comprising a SLS with a period P defined by a $AlAs_xSb_{1-x}$ first layer, a $GaAs_ySb_{1-y}$ second layer, and an $InAs_{1-z}Sb_z$ third layer. This sequence is repeated across the barrier layer 830. Only the $InAs_{1-z}Sb_z$ layers are doped n-type. The remaining layers are unintentionally doped.

FIG. 9B depicts another triangular barrier layer 830' comprising a SLS with a period P defined by an $InAs_{1-z}Sb_z$ first layer, a $GaAs_ySb_{1-y}$ second layer, and an $AlAs_xSb_{1-x}$ third layer. This sequence is repeated across the barrier layer 830'. Only the $InAs_{1-z}Sb_z$ layers are doped n-type. The remaining layers are unintentionally doped.

FIG. 9C depicts a serpentine-shaped barrier layer 830'' comprising a SLS with a period P defined by an $AlAs_xSb_{1-x}$ first layer, an $InAs_{1-z}Sb_z$ second layer, an $AlAs_xSb_{1-x}$ third layer, and a $GaAs_ySb_{1-y}$ fourth layer. This sequence is repeated across the barrier layer 830'. Only the $InAs_{1-z}Sb_z$ layers are doped n-type. The remaining layers are unintentionally doped.

FIG. 9D depicts an arbitrary sequence barrier layer 830''' comprising a SLS with a period P defined by a $AlAs_xSb_{1-x}$ first layer, an $InAs_{1-z}Sb_z$ second layer, and a repeating sequence of alternating layers of $AlAs_xSb_{1-x}$ and $GaAs_ySb_{1-y}$ (i.e., third through mth layers).

To dope the SLS barrier layer n-type, only the $InAs_{1-x}Sb_x$ layer may be doped using, as an example, a silicon source with high precision down to a level as low as 1E15 cm$^3$, while leaving other antimonide layers unintentionally doped. In these structures, the electron level is mainly controlled by the thickness of InAsSb layers, while the hole level is mainly controlled by the $GaAs_ySb_{1-y}$ layers. The detailed sequence and thickness is dependent on simultaneous satisfaction of the lattice matching condition, and the required valence/conduction band positions. The detailed sequence and thickness also depends on the desired shutter sequencing and ease of flux controls when switching from one layer to another. It is also noted that for some of the sequencing, e.g. as illustrated in FIG. 9C, the electron and hole wave function overlap is minimized to reduce unwanted optical absorption.

Figure 10A:
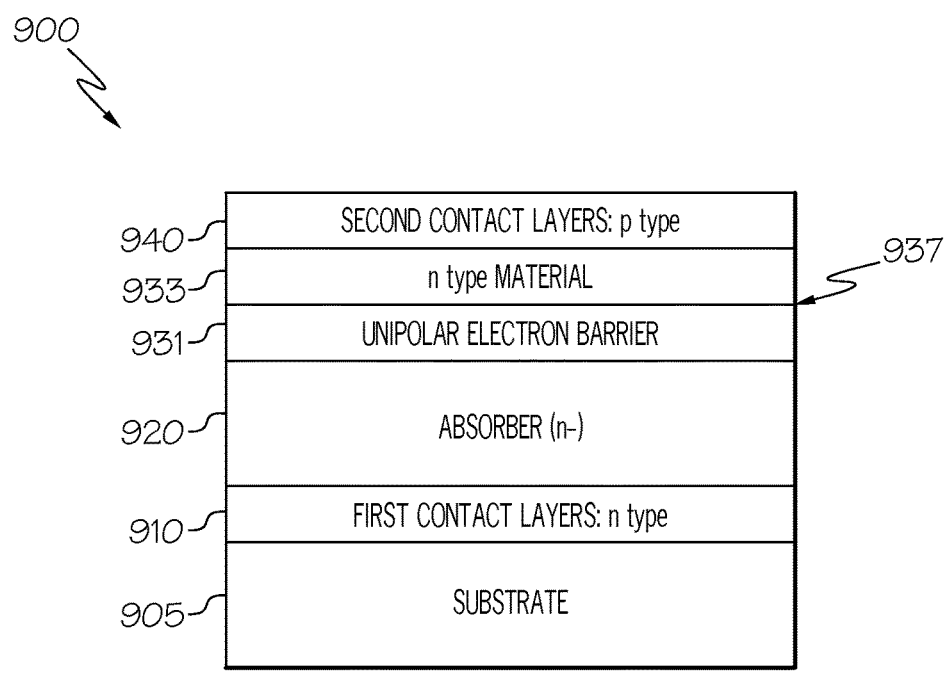
FIG. 10A is schematic illustration of an example device structure with an n-type absorber layer wherein a p-n junction is formed outside of the barrier layer according to one or more embodiments described and illustrated herein.

Now referring to FIG. 10A, a device structure 900 with p-n junction after barrier growth is schematically illustrated. The device structure 900 includes a substrate 905, n-type contact layers 910, an n-type absorber layer 920, a barrier layer 931, an n-type material layer 933 adjacent to the barrier layer 931, and a p-type second contact layer 940. The barrier layer 931 is nominally undoped. The n-type material layer 933 and the p-type second contact layer 940 form a p-n junction 937. In this structure, the p-n junction 937 is formed after the barrier layer 931, rather than of within. The GR current, and any possible tunneling current generated within the p-n junction, is blocked by the barrier layer 931, while the device still benefits from the built-in electric field formed by the p-n junction 937.

Figure 10B:
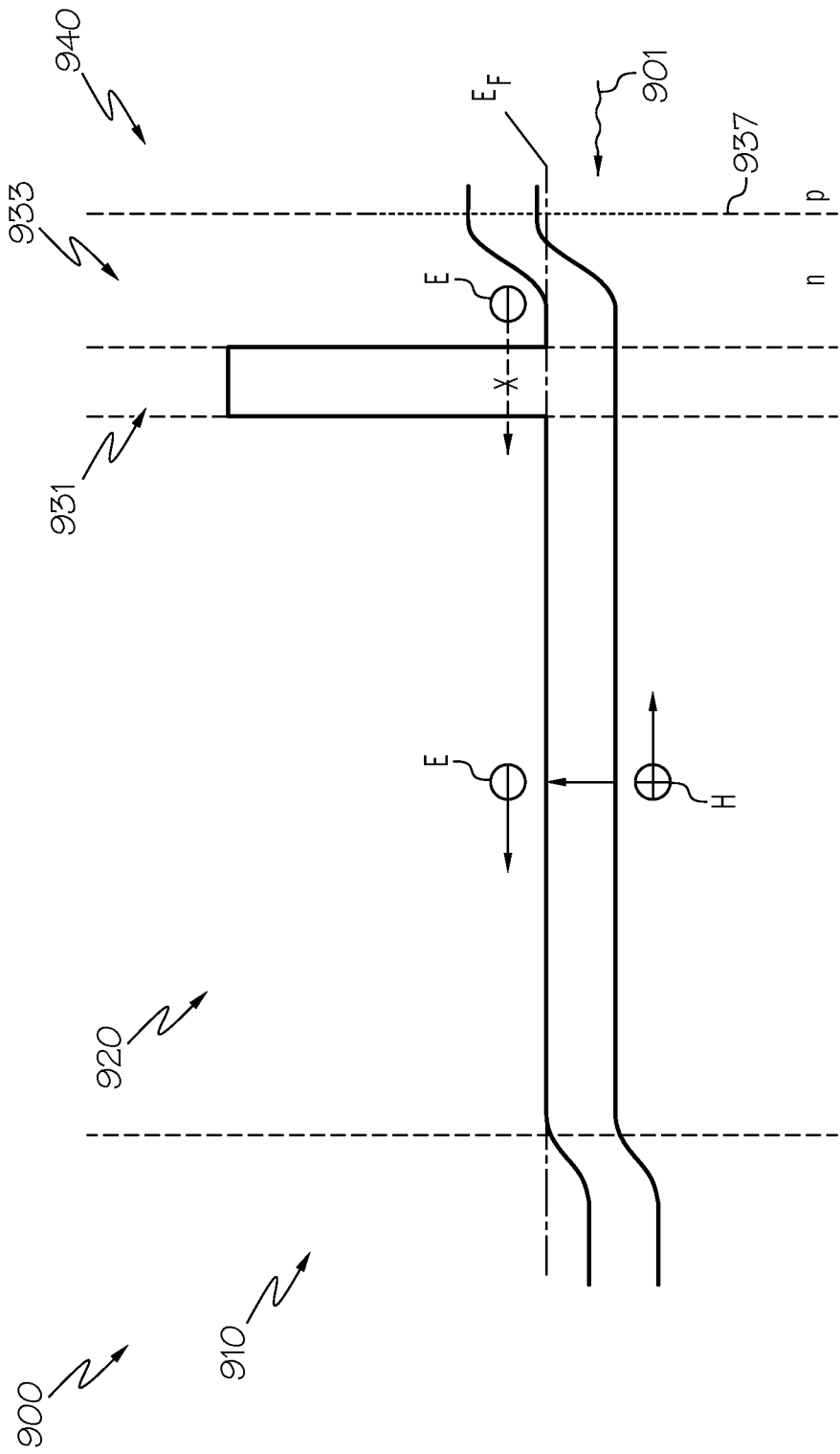
FIG. 10B is a graphic illustration of a band diagram for the device structure depicted in FIG. 10A according to one or more embodiments described and illustrated herein.

FIG. 10B illustrates an example band diagram for a device structure 900 as illustrated in FIG. 10A with p-n junction 937 made of a same bandgap material as the n-type absorber layer 920. Incident infrared radiation is shown as arrow 901. It should be understood that embodiments are not limited to any incident direction, as the infrared radiation may enter from the substrate side (i.e., backside illuminated) or the epi layer side (i.e., frontside illuminated).

Figure 10C:
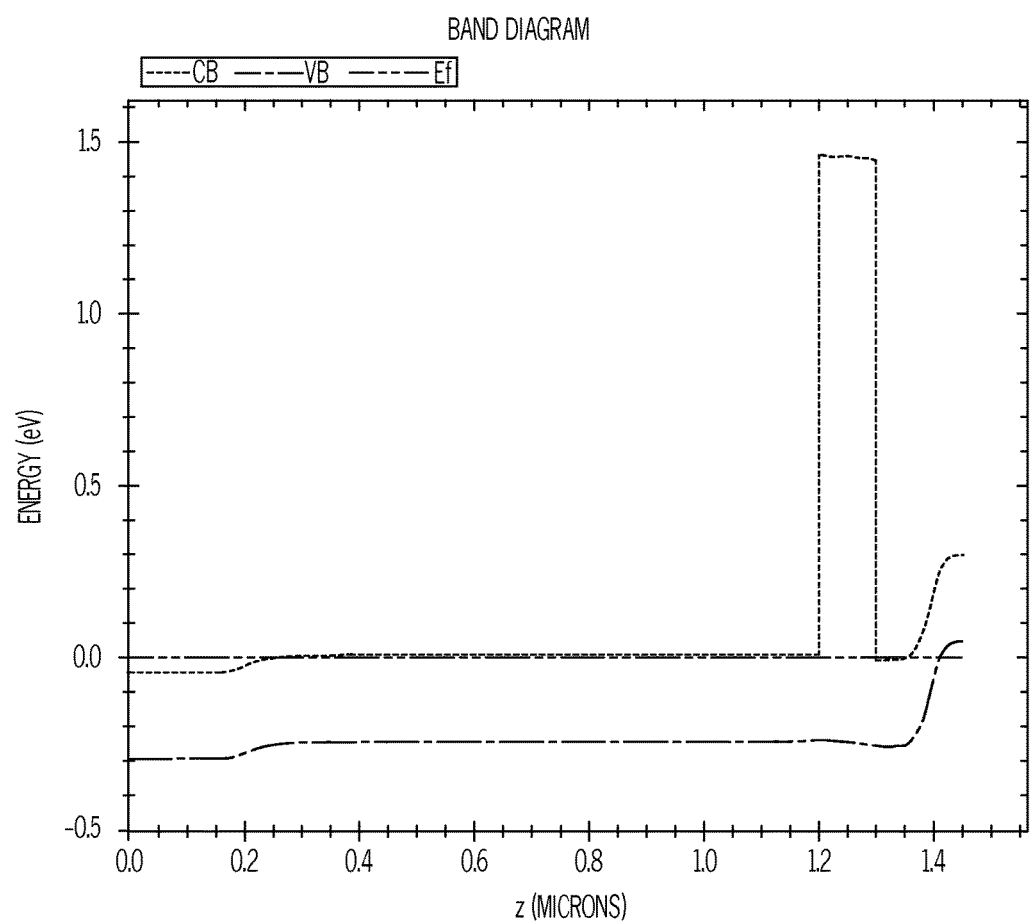
FIG. 10C is a graphic illustration of a band diagram for the device structure depicted in FIG. 10A that is based on mid-wave infrared InAs/InAsSb superlattice structure absorber material according to one or more embodiments described and illustrated herein.

Due to the presence of the barrier layer 931, the GR current generated with the p-n junction 937 cannot pass through the barrier layer 931 and will be suppressed. If there would be any band to band tunneling current or trap assisted tunneling, they would not be able to pass through the barrier either. If the electrons cannot pass through the barrier layer 931, the matching holes would not be able to travel through the device structure 900 due to charge neutrality requirement. When a bias is applied, most of the bias would still be applied to the barrier layer 931, and little would be present across the p-n junction 937. Therefore, the p-n junction 937 would be always near zero biased, unlike a p-i-n photodiode device. If the barrier is lightly doped (e.g. unintentional background doping), most bias voltage could be present across the p-n junction. This would make the dark current less bias dependent. FIG. 10C illustrates a band diagram of an example device having the device structure depicted in FIG. 10A and based on MWIR InAs/InAsSb SLS absorber material. The n-doping profile within the p-n junction region can be adjusted to allow a very shallow hole barrier (i.e., the valence band edge of the n-type material layer is lower than that of the absorber layer). This is to ensure that no electric field is propagated to the absorber region. Under slight bias, this shallow hole barrier will disappear, allowing minority holes to pass through.

Figure 10D:
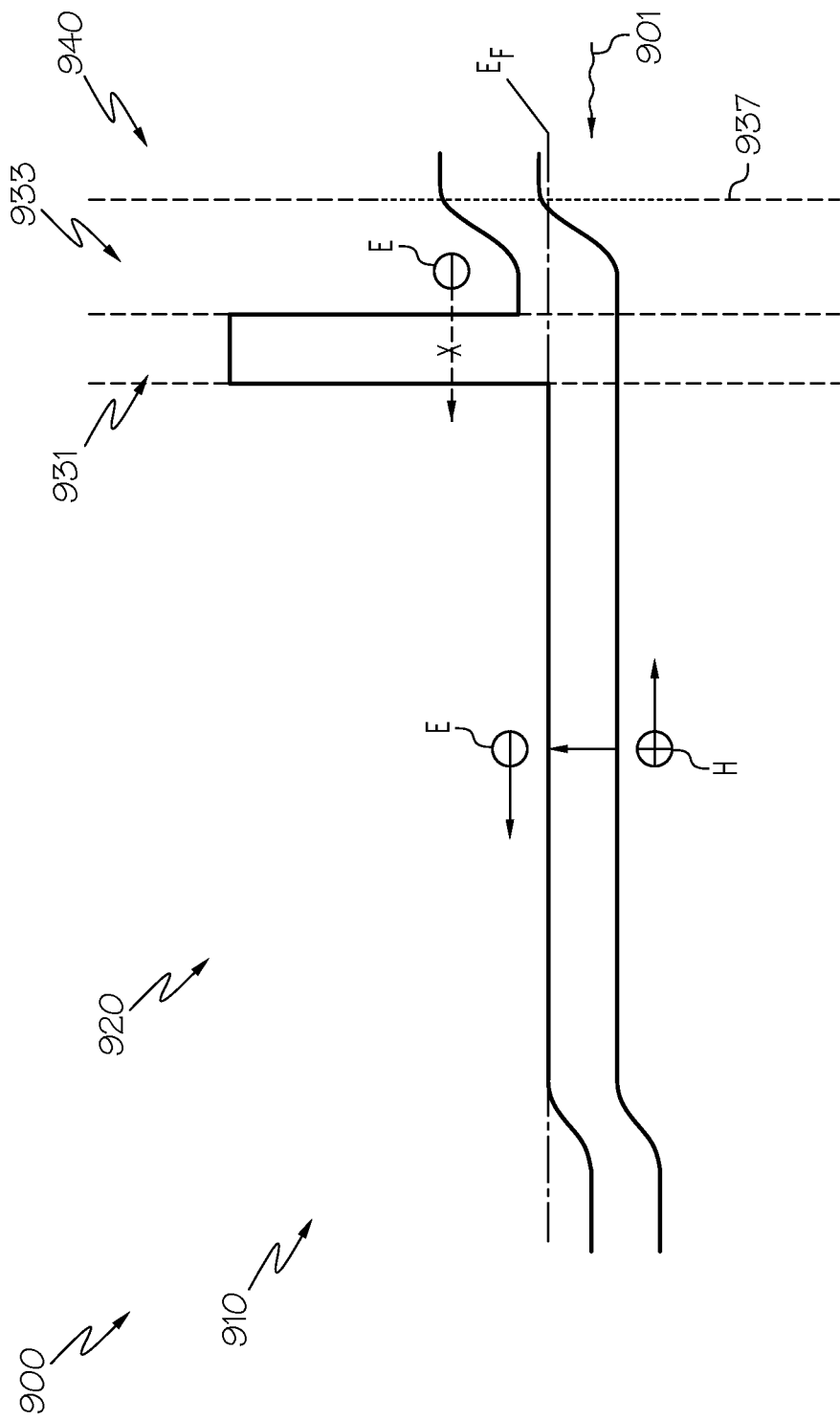
FIG. 10D is a graphic illustration of a band diagram for the device structure depicted in FIG. 10A wherein a wider bandgap material is used in the n-type material layer according to one or more embodiments described and illustrated herein.

For some other materials than the InAs/InAsSb SLS, if the valence band offset can be maintained while varying the bandgap, a wider bandgap material can be used in the n-type material layer 933 to form the p-n junction 937, as illustrated in FIG. 10D. As used herein, the phrase "wider bandgap" means a bandgap that is wider than that of the absorber layer.

Figure 11A:
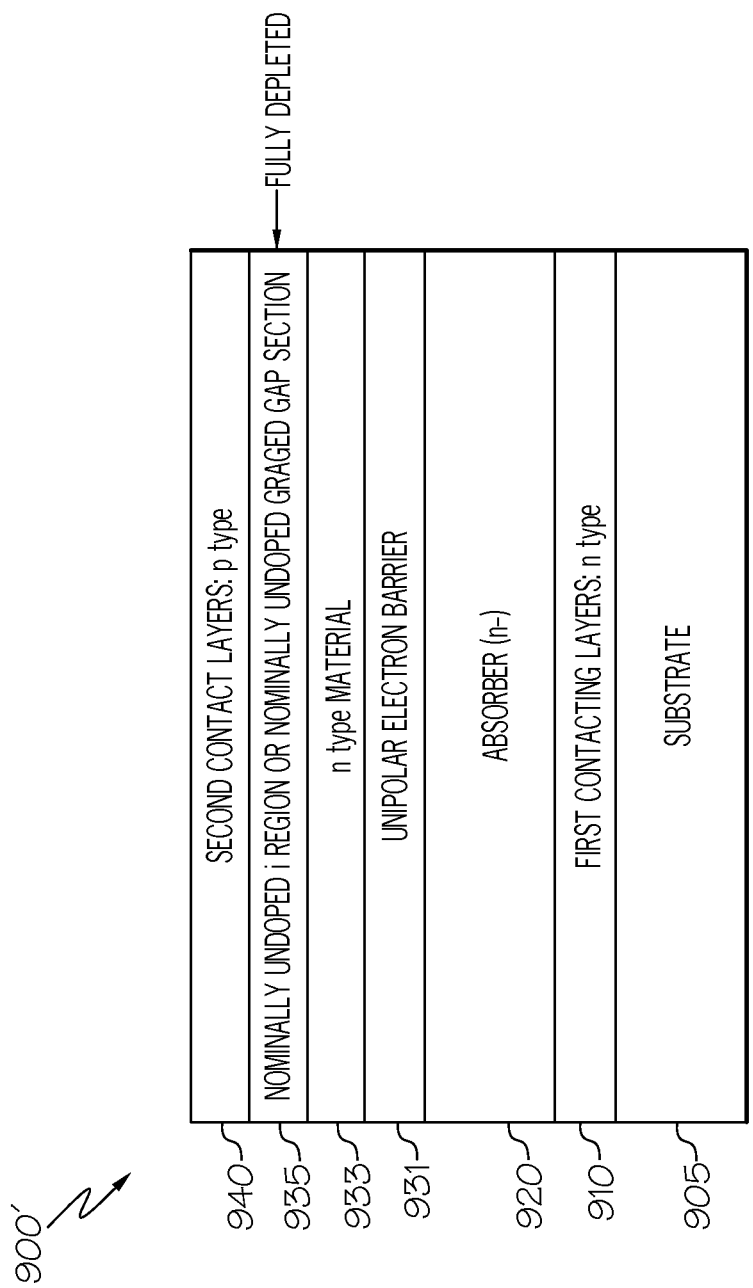
FIG. 11A is a schematic illustration of a diode barrier device structure including an n-type absorber layer and a nominally undoped i region or nominally undoped graded gap section between an n-type material layer and a p-type contact layer according to one or more embodiments described and illustrated herein.
Figure 11B:
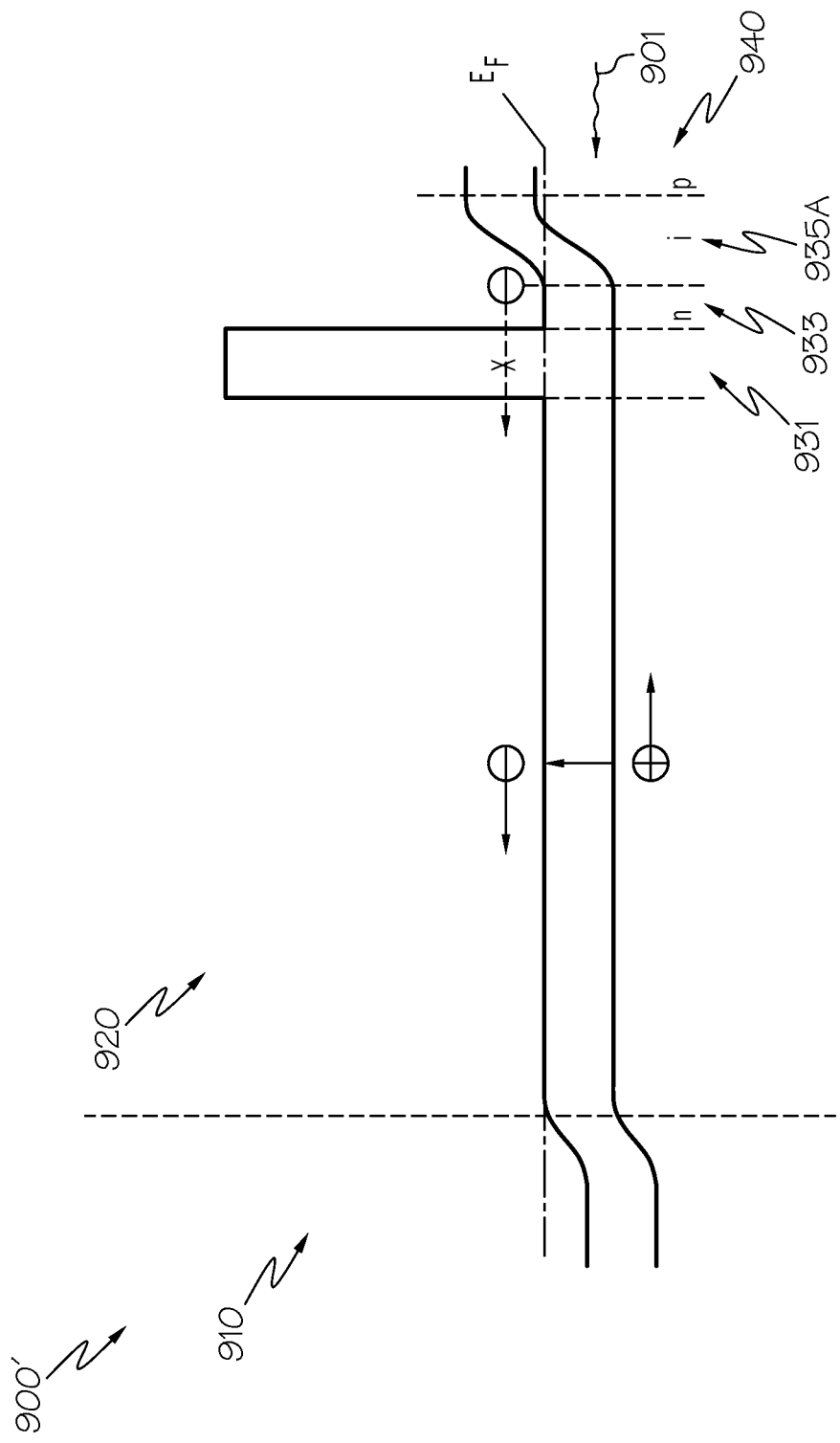
FIG. 11B is a graphic illustration of a band diagram for the device structure depicted in FIG. 11A with a nominally undoped i region according to one or more embodiments described and illustrated herein.

FIG. 11A illustrates device structure 900' similar to the device structure 900 depicted in FIG. 10A wherein a nominally undoped i region or a nominally undoped graded gap region 935 is inserted between the n-type material layer 933 and the p-type second contact layer 940. Referring specifically to FIG. 11B, a nominally undoped i-region 935A is disposed between the n-type material layer 933 and the p-type second contact layer 940. This i-region will become fully depleted under normal operating conditions. It should be understood that the embodiment depicted in FIG. 11B is a variation of the embodiment depicted in FIG. 10B.

Figure 11C:
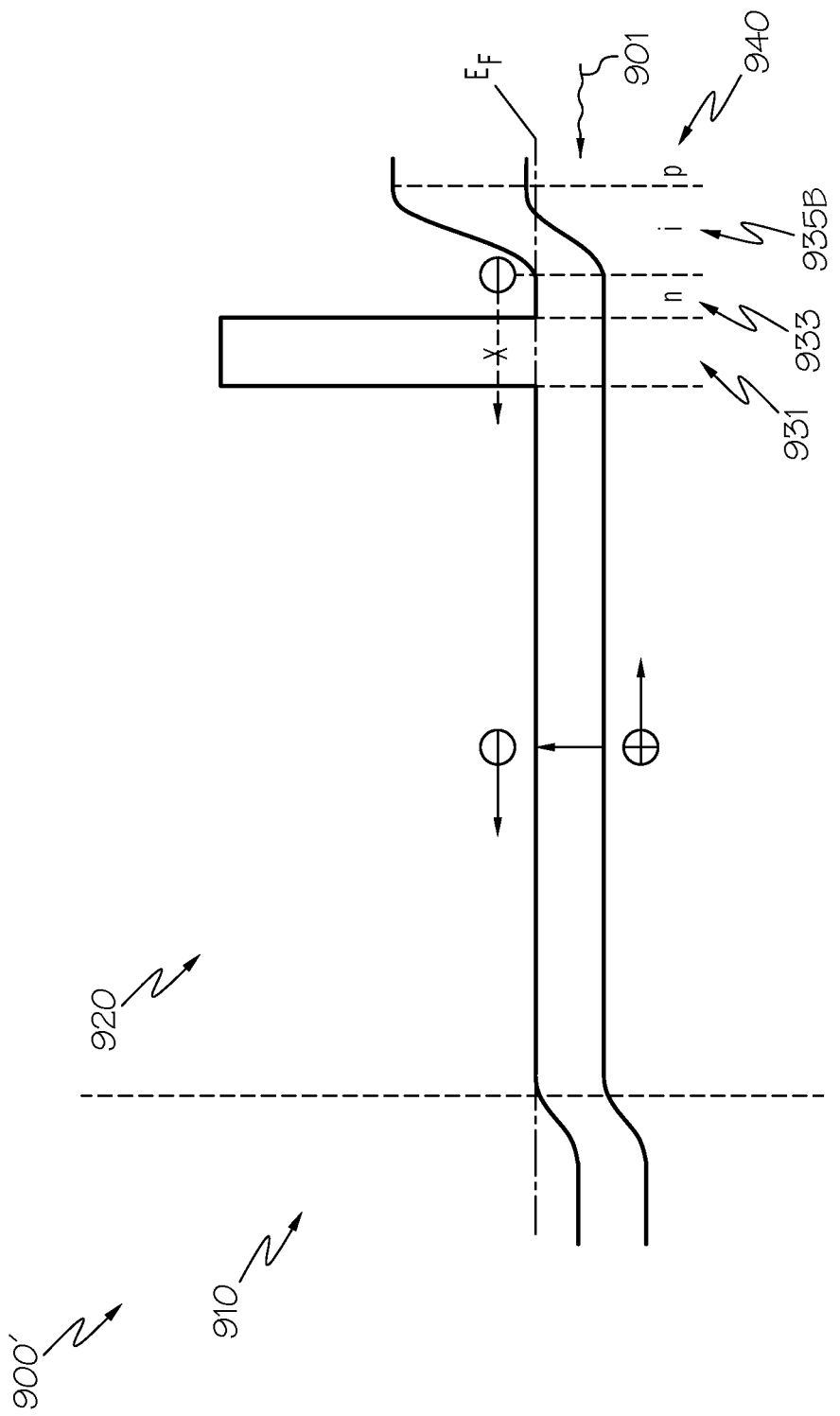
FIG. 11C is a graphic illustration of a band diagram for the device structure depicted in FIG. 11A with a nominally undoped graded gap section according to one or more embodiments described and illustrated herein.

Referring now to FIG. 11C, a nominally undoped graded gap section 935B is disposed between the n-type material layer 933 and the p-type second contact layer 940. The material of the n-type material layer 933 is the same as that of the n-type absorber layer 920 except that the doping level could be different. The bandgap of the nominally undoped graded gap section 935B is varied from that of the n-type material layer 933 to that of a wider bandgap material of the p-type second contact layer 940. There will be less wasted optical absorption before infrared radiation reaches the absorber material, leading to maximized device quantum efficiency. The grading scheme is particularly beneficial for InAs/InAsSb SLS.

Figure 12A:
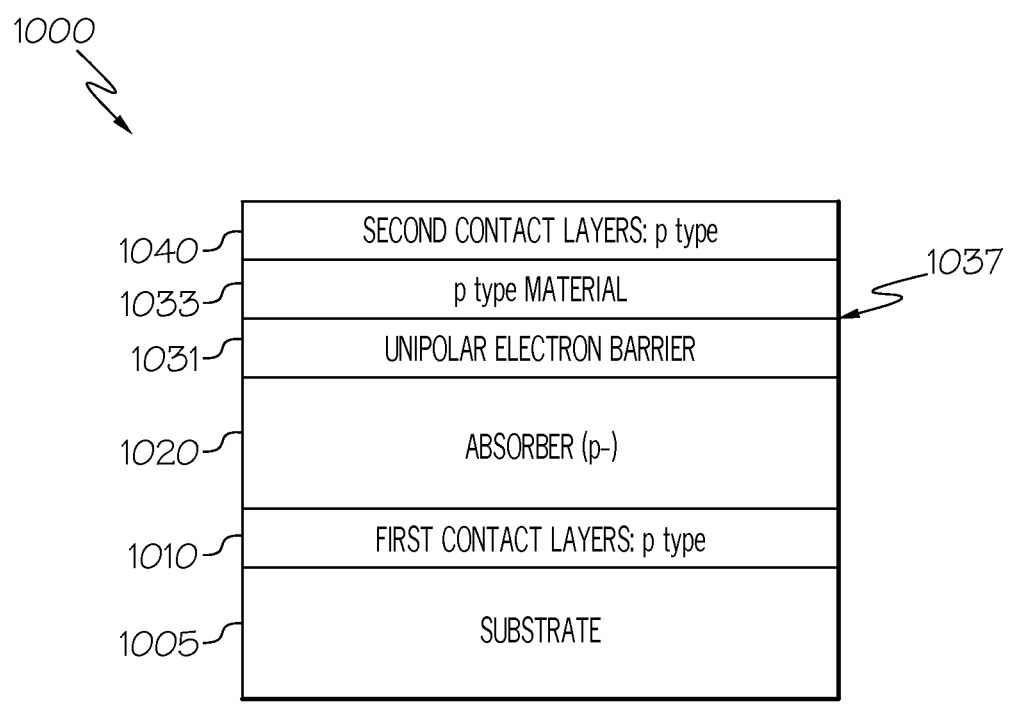
FIG. 12A is schematic illustration of an example device structure with a p-type absorber layer wherein a p-n junction is formed outside of the barrier layer according to one or more embodiments described and illustrated herein.

Similarly for a device structure using a p-type absorber material, a p-n junction can be provided after the barrier layer, as illustrated in FIG. 12A. The device structure 1000 includes a substrate 1005, p-type contact layers 1010, an p-type absorber layer 1020, a barrier layer 1031, an p-type material layer 1033 adjacent to the barrier layer 1031, and an n-type second contact layer 1040. The barrier layer 1031 is nominally undoped. The p-type material layer 1033 and the n-type second contact layer 1040 form a p-n junction 1037. In this structure, the p-n junction 1037 is formed after the barrier layer 1031, rather than of within. The GR current, and any possible tunneling current generated within the p-n junction, is blocked by the barrier layer 1031, while the device still benefits from the built-in electric field formed by the p-n junction 1037.

Figure 12B:
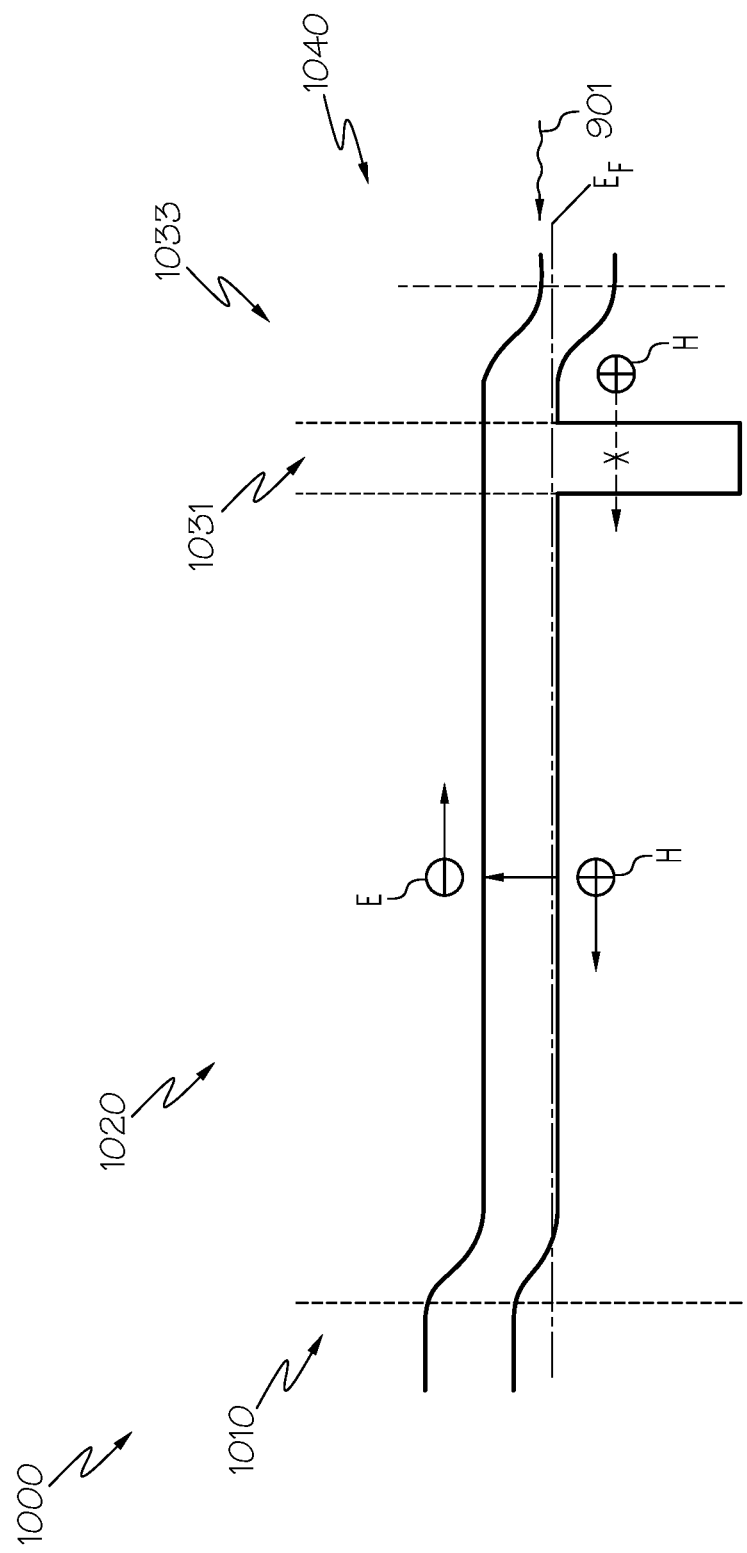
FIG. 12B is a graphic illustration of a band diagram for the device structure depicted in FIG. 12A according to one or more embodiments described and illustrated herein.
Figure 12C:
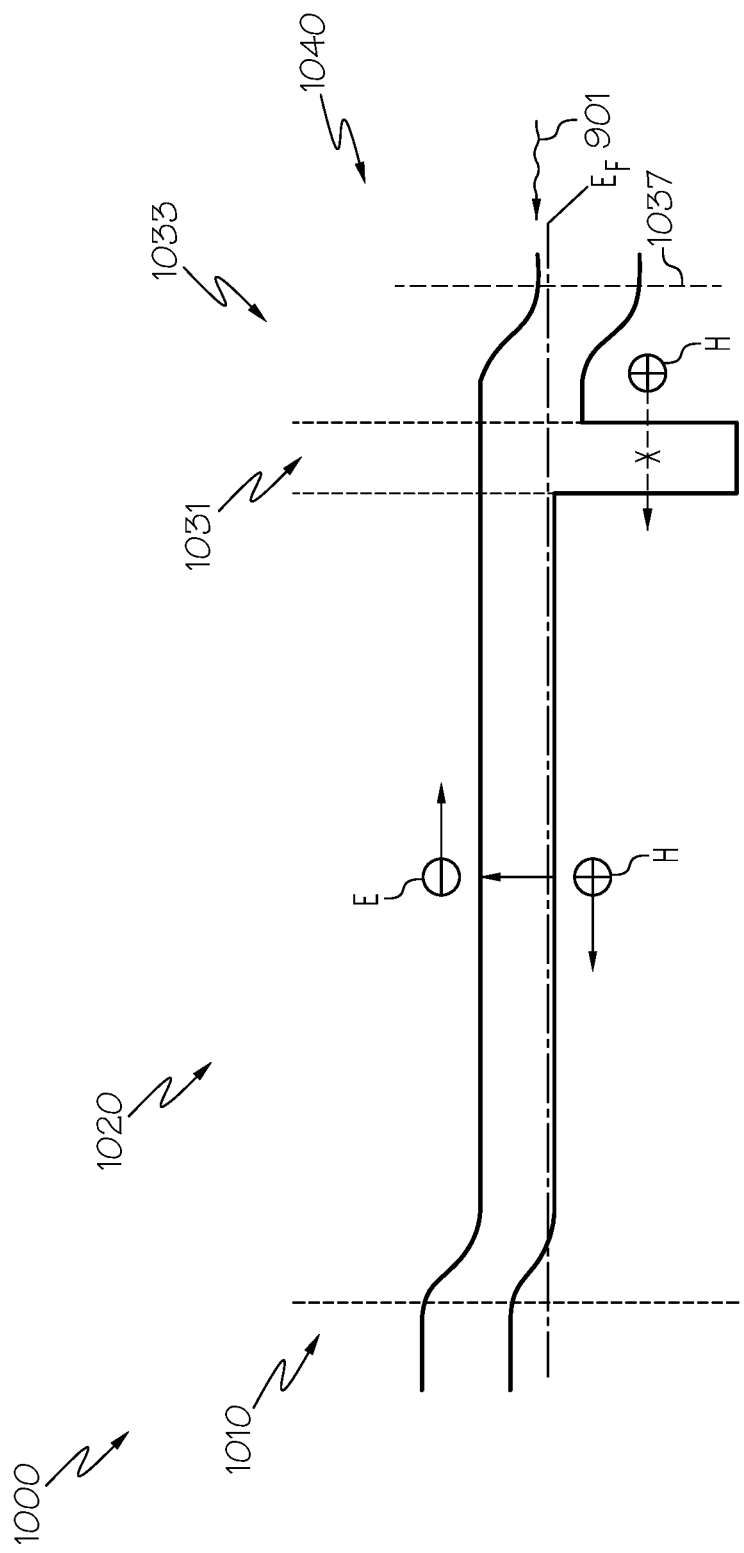
FIG. 12C is a graphic illustration of a band diagram for the device structure depicted in FIG. 10A wherein a wider bandgap material is used in the p-type material layer according to one or more embodiments described and illustrated herein.

An example band alignment of the device structure 1000 shown in FIG. 12A is illustrated in FIG. 12B where the material of the p-type material layer 1033 and the n-type second contact layer 1040 is the same material as the p-type absorber layer 1020 except for the doping levels. Additionally, for InAs/InAsSb SLS, as the conduction band offset for InAs/InAsSb SLS will not change nominally as the bandgap varies, wider bandgap materials can be utilized directly to form the p-n junction, as illustrated in FIG. 12C.

Figure 13A:
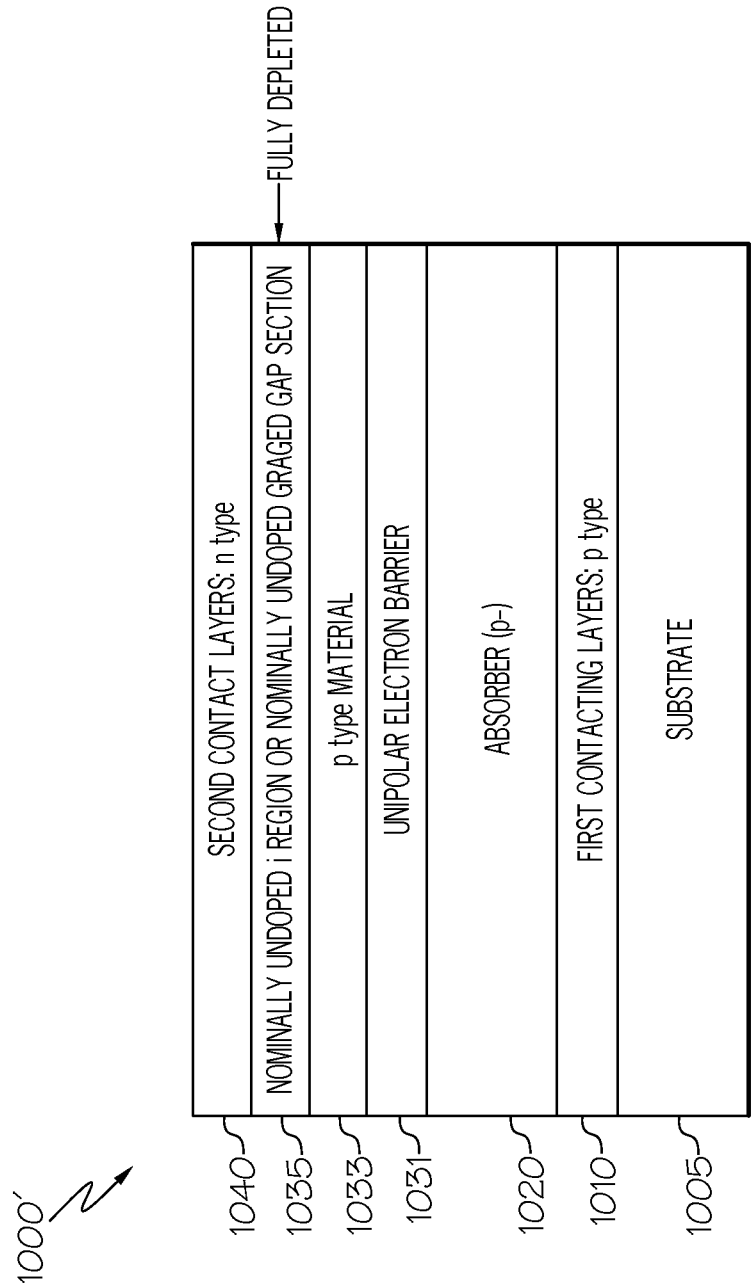
FIG. 13A is a schematic illustration of a diode barrier device structure including a p-type absorber layer and a nominally undoped i region or nominally undoped graded gap section between a p-type material layer and an n-type contact layer according to one or more embodiments described and illustrated herein.
Figure 13B:
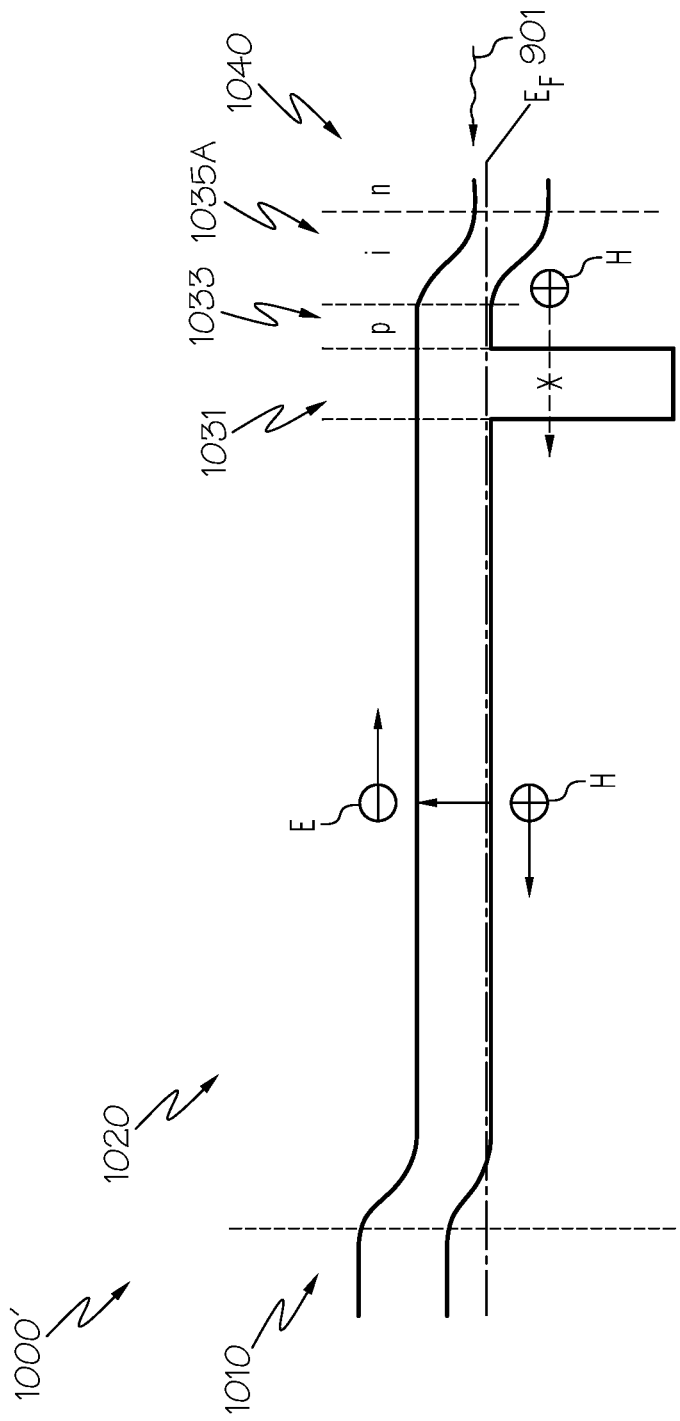
FIG. 13B is a graphic illustration of a band diagram for the device structure depicted in FIG. 13A with a nominally undoped i region according to one or more embodiments described and illustrated herein.
Figure 13C:
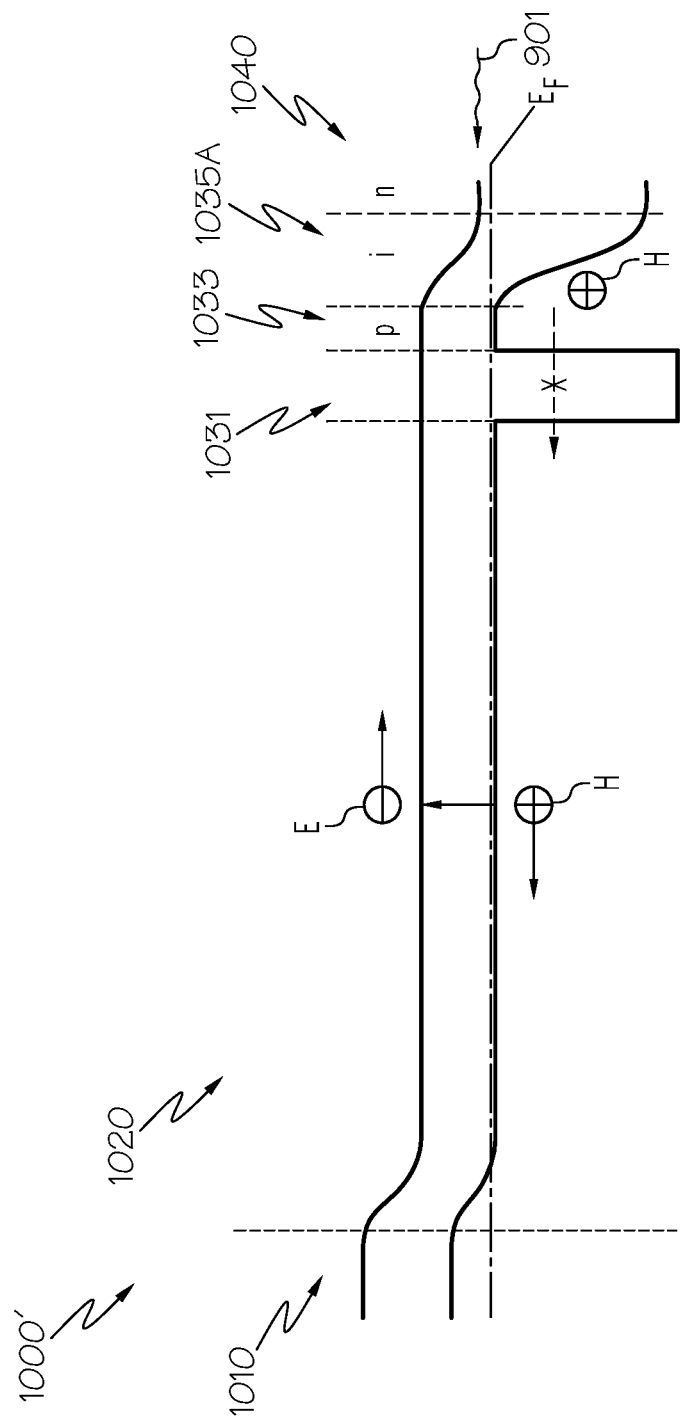
FIG. 13C is a graphic illustration of a band diagram for the device structure depicted in FIG. 13A with a nominally undoped graded gap section according to one or more embodiments described and illustrated herein.

FIG. 13A illustrates device structure 1000' similar to the device structure 1000 depicted in FIG. 12A wherein a nominally undoped i region or a nominally undoped graded gap region 1035 is inserted between the p-type material layer 1033 and the n-type second contact layer 1040. Referring specifically to FIG. 13B, a nominally undoped i-region 1035A is disposed between the p-type material layer 1033 and the n-type second contact layer 1040. This i-region will become fully depleted under normal operating conditions. It should be understood that the embodiment depicted in FIG. 13B is a variation of the embodiment depicted in FIG. 12B., Referring now to FIG. 13C, a nominally undoped graded gap section 1035B is disposed between the p-type material layer 1033 and the n-type second contact layer 1040. The material of the p-type material layer 1033 is the same as that of the p-type absorber layer 1020 except that the doping level could be different. The bandgap of the nominally undoped graded gap section 1035B is varied from that of the p-type material layer 1033 to that of a wider bandgap material of the n-type second contact layer 1040. There will be less wasted optical absorption before infrared radiation reaches the absorber material, leading to maximized device quantum efficiency. The grading scheme is particularly beneficial for InAs/InAsSb SLS.

It is noted that the p-doping profile within the p-n junction region of the embodiments illustrated in FIGS. 12A-12C and 13A-13C can be adjusted to allow a very shallow electron barrier (i.e., the conduction band edge of the p-type material layer is higher than that of the absorber layer). This is to ensure that no electric field is propagated to the absorber region. Under slight bias, this shallow electron barrier will disappear, allowing minority electrons to pass through.

It should now be understood that embodiments of the present disclosure are directed to diode barrier infrared detector devices having a barrier layer with zero or almost zero valance band offset from a material of an absorber layer. A diode structure is formed within or adjacent to the barrier layer, thereby providing a built-in electric field for close to zero bias optical turn on, while also limiting the depletion region within the barrier layer within small bias range. Additionally, embodiments of the present disclosure are directed to a SLS barrier layer scheme comprising an arbitrary sequence of $AlAs_xSb_{1-x}/GaAs_ySb_{1-y}/InAs_{1-z}Sb_z$ layers. This SLS barrier layer may be doped n-type precisely using silicon that is readily available in a MBE system.

What is claimed is:

1. A diode barrier infrared detector device comprising:
   a first contact layer;
   an absorber layer adjacent to the first contact layer;
   a barrier layer adjacent to the absorber layer, wherein the barrier layer comprises a diode structure formed by a p-n junction formed within the barrier layer; and
   a second contact layer adjacent to the barrier layer, wherein the diode structure comprises:
      an n-doped barrier layer adjacent to the absorber layer, the n-doped barrier layer comprising a first n-doped barrier region having a first doping level, a second n-doped barrier region having a second doping level, and a third n-doped barrier region having a third doping level, wherein:
         the first n-doped barrier region is adjacent to the absorber layer;
         the second n-doped barrier region is disposed between the first n-doped barrier region and the third n-doped barrier region;
         the third doping level is greater than the second doping level; and
         the second doping level is greater than the first doping level; and
      a p-doped barrier layer disposed between the third n-doped barrier region of the n-doped barrier layer and the second contact layer, wherein the n-doped barrier layer has a thickness that is greater than a thickness of the p-doped barrier layer.

2. The diode barrier infrared detector device of claim 1, wherein the barrier layer is such that there is substantially no barrier to minority carrier holes.

3. The diode barrier infrared detector device of claim 1, wherein the p-n junction formed within the barrier layer is closer to the second contact layer than the absorber layer.

4. The diode barrier infrared detector device of claim 1, wherein the absorber layer comprises an n-doped InAs/InAsSb superlattice structure, and the barrier layer comprises AlAsSb or AlGaAsSb.

5. The diode barrier infrared detector device of claim 1, wherein a depletion region is contained entirely within the barrier layer.

6. The diode barrier infrared detector device of claim 1, wherein:
   a thickness of the first n-doped barrier region is greater than a thickness of the third n-doped barrier region; and
   the thickness of the third n-doped barrier region is greater than a thickness of the second n-doped barrier region.

7. The diode barrier infrared detector device of claim 6, wherein:

the first doping level is about $2.5 \times 10^{15}$;
the second doping level is about $6.0 \times 10^{16}$;
the third doping level is about $1.7 \times 10^{17}$; and
a doping level of the p-doped barrier layer is about $3.0 \times 10^{17}$.

8. A superlattice barrier structure comprising a repeating sequence of an $AlAs_xSb_{1-x}$ layer, a $GaAs_ySb_{1-y}$ layer, and an $InAs_{1-z}Sb_z$ layer defining a superlattice structure, wherein:
   $0<x<1$, $0<y<1$, and $0<z<1$;
   the $InAs_{1-z}Sb_z$ layers are n-doped; and
   the $AlAs_xSb_{1-x}$ layers and the $GaAs_ySb_{1-y}$ layers are unintentionally doped.

9. The superlattice barrier structure of claim 8, wherein the repeating sequence of $AlAs_xSb_{1-x}$, $GaAs_ySb_{1-y}$, and $InAs_{1-z}Sb_z$ define a period of the superlattice structure, and the period is such that a first layer is $AlAs_xSb_{1-x}$, a second layer is $GaAs_ySb_{1-y}$, and a third layer is $InAs_{1-z}Sb_z$.

10. The superlattice barrier structure of claim 8, wherein the repeating sequence of $AlAs_xSb_{1-x}$, $GaAs_ySb_{1-y}$, and $InAs_{1-z}Sb_z$ define a period of the superlattice structure, and the period is such that a first layer is $InAs_{1-z}Sb_z$, a second layer is $GaAs_ySb_{1-y}$, and a third layer is $AlAs_xSb_{1-x}$.

11. The superlattice barrier structure of claim 8, wherein the repeating sequence of $AlAs_xSb_{1-x}$, $GaAs_ySb_{1-y}$, and $InAs_{1-z}Sb_z$ define a period of the superlattice structure, and the period is such that a first layer is $AlAs_xSb_{1-x}$, a second layer is $InAs_{1-z}Sb_z$, a third layer is $AlAs_xSb_{1-x}$, and a fourth layer is $GaAs_ySb_{1-y}$.

12. The superlattice barrier structure of claim 8, wherein the repeating sequence of $AlAs_xSb_{1-x}$, $GaAs_ySb_{1-y}$, and $InAs_{1-z}Sb_z$ define a period of the superlattice structure, and the period is such that a first layer is $AlAs_xSb_{1-x}$, a second layer is $InAs_{1-z}Sb_z$, a third layer through an mth layer is an number of repeating layers of $AlAs_xSb_{1-x}$ and $GaAs_ySb_{1-y}$.

13. A diode barrier infrared detector device utilizing an n-type absorber comprising:
   a first contact layer, wherein the first contact layer is doped n-type;
   an absorber layer adjacent to the first contact layer, wherein the absorber layer is doped n-type;
   a barrier layer adjacent to the absorber layer;
   an n-type material layer adjacent to the barrier layer; and
   a second contact layer adjacent to the n-type material layer, wherein the second contact layer is p-doped.

14. The diode barrier infrared detector device according to claim 13, wherein the n-type material layer and the second contact layer comprise a material having a wider bandgap than a material of the absorber layer.

15. The diode barrier infrared detector device of claim 13, further comprising a nominally undoped i region disposed between the n-type material layer and the second contact layer.

16. The diode barrier infrared detector device of claim 13, further comprising a nominally undoped graded gap section disposed between the n-type material layer and the second contact layer.

17. A diode barrier infrared detector device comprising:
   a first contact layer;
   an absorber layer adjacent to the first contact layer;
   a barrier layer adjacent to the absorber layer, wherein the barrier layer comprises a diode structure formed by a p-n junction formed within the barrier layer; and
   a second contact layer adjacent to the barrier layer, wherein the diode structure comprises:
      an n-doped barrier layer adjacent to the absorber layer, wherein:

the n-doped barrier layer is doped at a doping level such that at least a portion of a valence band edge within the barrier layer is less than a valence band edge within the absorber layer;

the n-doped barrier layer comprises a first n-doped barrier region having a first doping level, a second n-doped barrier region having a second doping level, and a third n-doped barrier region having a third doping level;

the first n-doped barrier region is adjacent to the absorber layer;

the second n-doped barrier region is disposed between the first n-doped barrier region and the third n-doped barrier region;

the third doping level is greater than the second doping level; and the second doping level is greater than the first doping level; and a p-doped barrier layer disposed between the third n-doped barrier region of the n-doped barrier layer and the second contact layer.

18. The diode barrier infrared detector device of claim 17, wherein:

a thickness of the first n-doped barrier region is greater than a thickness of the third n-doped barrier region; and the thickness of the third n-doped barrier region is greater than a thickness of the second n-doped barrier region.

19. The diode barrier infrared detector device of claim 18, wherein:

the first doping level is about $2.5 \times 10^{15}$;

the second doping level is about $6.0 \times 10^{16}$;

the third doping level is about $2.0' 10^{17}$; and a doping level of the p-doped barrier layer is about $3.0 \times 10^{17}$.

20. A diode barrier infrared detector device comprising:

a first contact layer;

an absorber layer adjacent to the first contact layer;

a barrier layer adjacent to the absorber layer, wherein the barrier layer comprises:

a superlattice structure comprising a repeating sequence of an $AlAs_xSb_{1-x}$ layer, a $GaAs_ySb_{1-y}$ layer, and an $InAs_{1-z}Sb_z$ layer, wherein:

$0<x<1$, $0<y<1$, and $0<z<1$;

the $InAs_{1-z}Sb_z$ layers are n-doped; and the $AlAs_xSb_{1-x}$ layers and the $GaAs_ySb_{1-y}$ layers are unintentionally doped;

a p-doped barrier layer, wherein the superlattice structure and the p-doped barrier layer define a p-n junction within the barrier layer; and a second contact layer adjacent to the barrier layer.

* * * * *

UNITED STATES PATENT AND TRADEMARK OFFICE
CERTIFICATE OF CORRECTION

PATENT NO. : 9,515,210 B2
APPLICATION NO. : 14/271908
DATED : December 6, 2016
INVENTOR(S) : Yajun Wei Page 1 of 1

It is certified that error appears in the above-identified patent and that said Letters Patent is hereby corrected as shown below:

Claim 19, Column 16, Line 7, "the third doping level is about $2.0\text{'}10^{17}$; and" should read --the third doping level is about $2.0\times10^{17}$; and--.

Signed and Sealed this
Twenty-first Day of February, 2017

Michelle K. Lee
*Director of the United States Patent and Trademark Office*